United States Patent
Kim et al.

(10) Patent No.: US 12,062,628 B2
(45) Date of Patent: *Aug. 13, 2024

(54) SEMICONDUCTOR DEVICE

(71) Applicant: Samsung Electronics Co., Ltd., Suwon-si (KR)

(72) Inventors: Changbum Kim, Seoul (KR); Sunghoon Kim, Seongnam-si (KR); Daeseok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/126,996

(22) Filed: Mar. 27, 2023

(65) Prior Publication Data
US 2023/0230941 A1 Jul. 20, 2023

Related U.S. Application Data

(63) Continuation of application No. 17/218,230, filed on Mar. 31, 2021, now Pat. No. 11,637,077.

(30) Foreign Application Priority Data

Sep. 16, 2020 (KR) .......................... 10-2020-0118842

(51) Int. Cl.
*H01L 21/00* (2006.01)
*H01L 23/528* (2006.01)
(Continued)

(52) U.S. Cl.
CPC ............ *H01L 23/60* (2013.01); *H01L 23/528* (2013.01); *H01L 27/092* (2013.01)

(58) Field of Classification Search
CPC ...... H01L 23/60; H01L 23/528; H01L 27/092
See application file for complete search history.

(56) References Cited

U.S. PATENT DOCUMENTS 8,028,264 B2 * 9/2011 Shimada ............. H01L 27/0203
716/122
9,202,696 B2 * 12/2015 Yang ................... H01L 27/0207
(Continued)

FOREIGN PATENT DOCUMENTS

| CN | 105845676 A | * | 8/2016 | ....... H01L 21/76898 |
| CN | 114267675 A | * | 4/2022 | ........... H01L 23/528 |
| JP | 2011166116 A | | 8/2011 | |

OTHER PUBLICATIONS

Search Report issued Apr. 4, 2022 by the European Patent Office for corresponding application EP 21181905.7.

*Primary Examiner* — Laura M Menz
(74) *Attorney, Agent, or Firm* — Muir Patent Law, PLLC

(57) ABSTRACT

A semiconductor device includes a gate line extending in a first direction, parallel to an upper surface of a semiconductor substrate; a first active region including a first channel region disposed below the gate line and including a first conductivity-type impurity; a second active region disposed to be separated from the first active region in the first direction, including a second channel region disposed below the gate line, and including the first conductivity-type impurity; and a plurality of metal wirings disposed at a first height level above the semiconductor substrate, wherein at least one metal wiring, among the plurality of metal wirings, is directly electrically connected to the first active region, no metal wirings at the first height level are electrically connected to the second active region, and at least one metal wiring, among the plurality of metal wirings, is connected to receive a signal applied to the gate line.

20 Claims, 27 Drawing Sheets

(51) Int. Cl.
*H01L 23/60* (2006.01)
*H01L 27/092* (2006.01)

(56) References Cited

U.S. PATENT DOCUMENTS

| | | | |
|---|---|---|---|
| 9,613,181 B2 * | 4/2017 | Mikalo | G06F 16/168 |
| 10,062,697 B2 | 8/2018 | Lee et al. | |
| 10,096,608 B2 | 10/2018 | Morimoto et al. | |
| 10,217,742 B2 * | 2/2019 | Oh | H01L 27/0886 |
| 10,483,268 B2 | 11/2019 | Morimoto et al. | |
| 11,335,673 B2 | 5/2022 | Do et al. | |
| 11,469,291 B2 | 10/2022 | Diao et al. | |
| 11,637,077 B2 * | 4/2023 | Kim | H01L 23/60 |
| | | | 257/369 |
| 2002/0066067 A1 * | 5/2002 | Wang | G06F 30/39 |
| | | | 716/112 |
| 2014/0264520 A1 | 9/2014 | Reisiger | |
| 2015/0318273 A1 | 11/2015 | Lue et al. | |
| 2016/0225752 A1 * | 8/2016 | Chou | G06F 30/392 |
| 2018/0040606 A1 | 2/2018 | Chou et al. | |
| 2019/0252380 A1 * | 8/2019 | Sharma | H01L 27/0924 |
| 2020/0105739 A1 * | 4/2020 | Yang | H01L 27/088 |
| 2022/0020691 A1 * | 1/2022 | You | H01L 27/0924 |
| 2022/0084959 A1 * | 3/2022 | Kim | H01L 23/528 |
| 2022/0130759 A1 * | 4/2022 | Huang | H01L 21/76895 |
| 2022/0262666 A1 | 8/2022 | Or-Bach et al. | |
| 2022/0262797 A1 | 8/2022 | Bae et al. | |
| 2023/0094036 A1 * | 3/2023 | Park | H01L 29/41791 |
| | | | 257/347 |
| 2023/0106015 A1 * | 4/2023 | Kim | H01L 29/0673 |
| | | | 257/288 |
| 2023/0230941 A1 * | 7/2023 | Kim | H01L 27/092 |
| | | | 257/369 |

* cited by examiner

SEMICONDUCTOR DEVICE

CROSS-REFERENCE TO RELATED APPLICATION(S)

This application is a continuation application of U.S. patent application Ser. No. 17/218,230, filed Mar. 31, 2021, which claims the benefit of priority to Korean Patent Application No. 10-2020-0118842 filed on Sep. 16, 2020 in the Korean Intellectual Property Office, the disclosure of each of which is incorporated herein by reference in its entirety.

BACKGROUND

The present inventive concept relates to a semiconductor device.

A semiconductor device may be classified as a semiconductor memory device storing data, a semiconductor logic device operating and processing data, or a hybrid semiconductor device including a memory element and a logic element. In general, a semiconductor device may be manufactured to include a transistor and an antenna device in a predetermined region of a semiconductor substrate. The antenna device may naturally emit plasma ions into the semiconductor substrate during a process of manufacturing the semiconductor device, to protect the transistor from plasma damage. However, it is typical to additionally use an area for an arrangement of the antenna device, according to a change in thickness of the transistor for improving an operation speed of the semiconductor device. For this reason, there may be a problem that a size of the semiconductor device may increase and a degree of freedom of a metal wiring may decrease.

SUMMARY

An aspect of the present inventive concept is to provide an integrated semiconductor device using a semiconductor device utilizing an empty space to increase a channel region, instead of disposing an antenna device.

According to an aspect of the present inventive concept, a semiconductor device includes a gate line extending in a first direction, parallel to an upper surface of a semiconductor substrate; a first active region including a first channel region disposed below the gate line and including a first conductivity-type impurity; a second active region disposed to be separated from the first active region in the first direction, including a second channel region disposed below the gate line, and including the first conductivity-type impurity; and a plurality of metal wirings disposed at a first height level above the semiconductor substrate, wherein at least one metal wiring, among the plurality of metal wirings, is directly electrically connected to the first active region, the plurality of metal wirings at the first height level are electrically separated from the second active region, and at least one metal wiring, among the plurality of metal wirings, is connected to receive a signal applied to the gate line.

According to an aspect of the present inventive concept, a semiconductor device includes a plurality of gate lines including a plurality of first gate lines extending in a first direction, parallel to an upper surface of a semiconductor substrate, and a second gate line extending in the first direction and having a length, different from a length of each of the plurality of first gate lines in the first direction; a first active region including first channel regions disposed below the plurality of gate lines and including a first conductivity-type impurity; a second active region disposed to be separated from the first active region in the first direction, including a second channel region disposed below the gate line, and including the first conductivity-type impurity; and a third active region including third channel regions disposed below the plurality of gate lines and including a second conductivity-type impurity, wherein a structure of the second gate line above each of the first channel regions is different from a structure of the second gate line above the second channel region.

According to an aspect of the present inventive concept, a semiconductor device includes a gate line extending in a first direction, parallel to an upper surface of a semiconductor substrate; a plurality of active regions including a plurality of channel regions below the gate line, which plurality of channel regions includes all channel regions of the semiconductor device, the channel regions disposed to be separated from each other in the first direction; a plurality of metal wirings disposed at a first height level to be electrically connected to the gate line and to a set of active regions including at least two of the plurality of active regions, the plurality of metal wirings including all metal wirings at the first height level of the semiconductor device; and a plurality of contacts connected to a set of active regions of the plurality of active regions. The semiconductor device is laid out to have a ratio of a total area of the plurality of metal wirings to a total area of the plurality of channel regions to be a value of 0.4 or more and 400 or less.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described with reference to the accompanying drawings.

Figure 1:
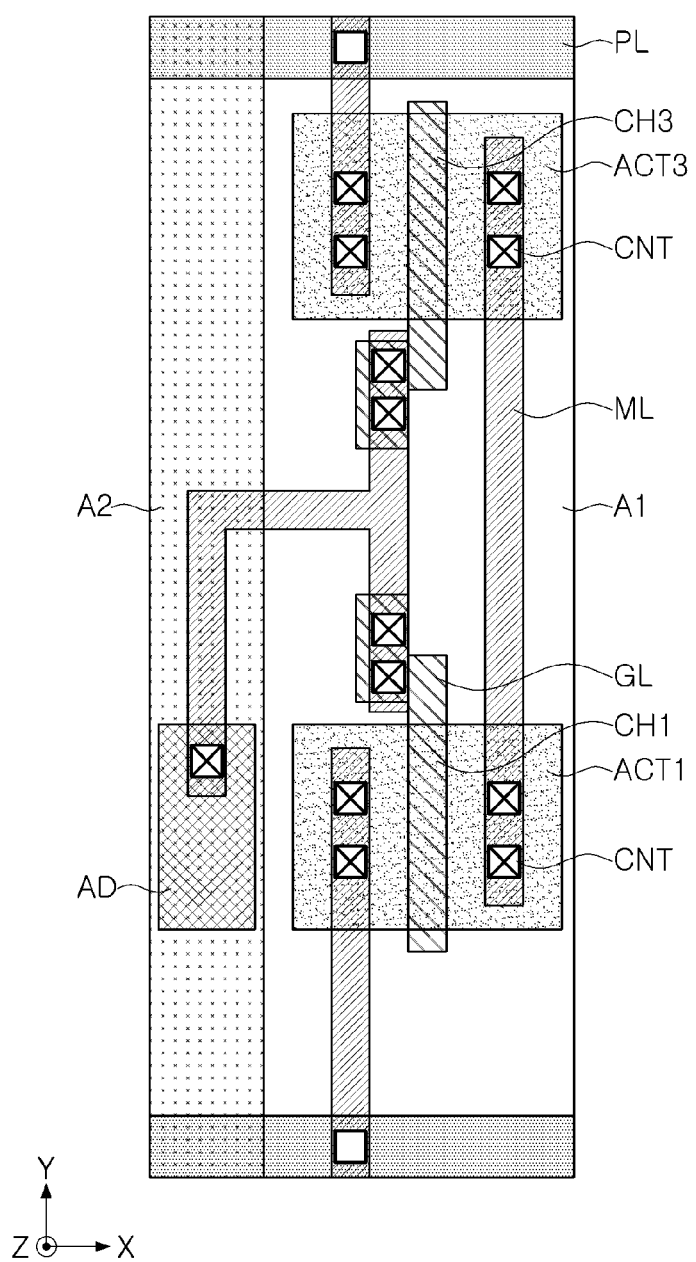
FIG. 1 is a layout diagram of a semiconductor device including an antenna device.

FIG. 1 is a layout diagram of a semiconductor device including an antenna device.

In general, a semiconductor device may include a transistor, a lower metal wiring, and other elements, arranged on the semiconductor substrate in a first direction (e.g., a Y direction) and a second direction (e.g., an X direction). A layout of the layers formed on a semiconductor substrate may be provided in various ways according to different embodiments. For example, three (3) lower metal wirings spaced apart in the second direction may be disposed above one (1) transistor (e.g., in the Z direction) in one example layout. For example, one (1) lower metal wiring among the three (3) lower metal wirings may be connected to an antenna device. The antenna device may naturally emit plasma ions, accumulated to form various patterns during a process of manufacturing the semiconductor device, into the semiconductor substrate, to protect the transistor from plasma damage. For example, the antenna device may be an antenna diode.

In order to improve performance of a semiconductor chip including a plurality of semiconductor devices each performing various operations, it is important to reduce sizes of elements included in each of the plurality of semiconductor devices or change a layout thereof, to reduce a size of the semiconductor chip. However, the sizes of the elements included in the semiconductor device may directly affect the performance of the semiconductor device, and thus there is a limit to reducing the size thereof. For example, recently, in order to increase an operation speed and improve performance of a semiconductor device, a semiconductor device including a transistor thinner than a conventional transistor in the second direction may be used, and thus, an arrangement of an antenna device may be problematic.

Referring to FIG. 1, a semiconductor device 1 including an antenna device AD may include two (2) lower metal wirings ML spaced apart in the second direction above one (1) transistor. For example, in a semiconductor device 1 using a transistor thinner than a conventional transistor in the second direction, unlike a conventional semiconductor device, a lower metal wiring ML may not be disposed above channel regions CH1 and CH3 of the transistor, and, thus, may require an additional area. A semiconductor chip including the semiconductor device 1 illustrated in FIG. 1 may increase in size due to an arrangement of the antenna device AD that uses the additional area, and may decrease a degree of freedom in arranging the lower metal wiring ML.

Otherwise, A lower metal wiring ML may be disposed above channel regions CH1 and CH3 of a transistor while using a transistor thinner than a conventional transistor. In this case, a decrease in performance of the semiconductor device 1 due to a decrease in thickness of the lower metal wiring ML may be more problematic, as compared to a problem of increasing the semiconductor chip in size due to the arrangement of the antenna device AD.

Referring to FIG. 1, the semiconductor device 1 including the antenna device AD, described as a general semiconductor device, may include a gate line GL, a first active region ACT1, a third active region ACT3, a plurality of lower metal wirings ML (shown as having the same shading as the single line labeled ML), and a plurality of contacts CNT, arranged in the X and Y directions. For example, the first active region ACT1 and the third active region ACT3 in a continuous pattern may extend in a direction intersecting the gate line GL. The plurality of contacts CNT may electrically connect the gate line GL and/or the active regions ACT1 and ACT3 to the plurality of lower metal wirings ML.

The semiconductor device 1 may provide a plurality of transistors from the gate line GL and the active regions ACT1 and ACT3. As described above, the lower metal wiring ML may not be disposed above the channel regions CH1 and CH3 of each of the plurality of transistors. Therefore, the antenna device AD for protecting the transistor from plasma damage may be disposed on one laterally-disposed surface of the semiconductor device 1. The antenna device AD may be electrically connected to the semiconductor device 1 by a lower metal wiring ML and a contact CNT. For example, the semiconductor device 1 may include a first region A1 in which the plurality of transistors are provided, and a second region A2 in which the antenna device AD is disposed. The second region A2 may be a region additionally employed for usage of the antenna device AD. Therefore, a size of the semiconductor chip may increase, and a degree of freedom in arranging the lower metal wiring ML may decrease. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

In the general semiconductor device 1 illustrated in FIG. 1, each gate line GL may extend in the first direction, e.g., the Y direction. Although only one (1) gate line GL is illustrated in FIG. 1 (e.g., shown to have an insulative gap between a first portion and a second portion of the gate line GL), the general semiconductor device 1 may include a plurality of gate lines. In addition, characteristics of the semiconductor device 1 illustrated in FIG. 1 may appear in at least a portion of the plurality of gate lines. The plurality of gate lines may have different shapes, and a set of the gate lines may be dummy gate lines arranged for separation from and/or layout with other peripheral semiconductor devices, as necessary. A thickness, an arrangement, and a shape of the gate line GL are not limited to the semiconductor device 1 illustrated in FIG. 1, depending on a process.

In the semiconductor device 1 illustrated in FIG. 1, at least a portion of the active regions ACT1 and ACT3 may be disposed to overlap the gate line GL. For example, the active regions ACT1 and ACT3 may be disposed to be spaced apart in the first direction in which the gate line GL extends. Transistors may be provided respectively, based on a region in which the active regions ACT1 and ACT3 and the gate line GL overlap. For example, the region in which the active regions ACT1 and ACT3 and the gate line GL overlap may include the channel regions CH1 and CH3 of the transistors. For example, the semiconductor device 1 illustrated in FIG. 1 may include one (1) gate line GL and two (2) active regions ACT1 and ACT3, and two (2) transistors may be provided therefrom. However, this is only illustrative and the present disclosure is not limited thereto.

The plurality of lower metal wirings ML, also described as a plurality of first-level metal wirings ML, may be wirings disposed at a first height level above the active regions ACT1 and ACT3 and the gate line GL (e.g., the closest horizontal metal wirings to the gate line GL in the Z direction), and may extend lengthwise in the Y direction. An item, layer, or portion of an item or layer described as extending "lengthwise" in a particular direction has a length in the particular direction and a width perpendicular to that direction, where the length is greater than the width. However, a direction in which the plurality of lower metal wirings ML extend may be different according to embodiments. For example, at least a portion of the lower metal wiring ML connected to the antenna device AD may extend lengthwise in the second direction perpendicular to the first direction (e.g., both the first and second directions being horizontal directions on the same plane). Power lines PL may be disposed at a second height level greater than the first height level on which the plurality of lower metal wirings ML are disposed. At least a portion of the plurality of lower metal wirings ML may be connected to the power lines PL through the contacts. However, this is only illustrative and the present disclosure is not limited thereto.

The power lines PL may supply a first voltage and a second voltage, which are different, to the semiconductor device 1 illustrated in FIG. 1, respectively, and may be electrically connected to source/drain regions formed on the active regions ACT1 and ACT3 through the plurality of contacts CNT. For example, a high power line may supply a first voltage, and a low power line may supply a second voltage lower than the first voltage. For example, the first voltage may be a power voltage, and the second voltage may be a ground voltage. However, this is only illustrative and the present disclosure is not limited thereto.

Figure 2:
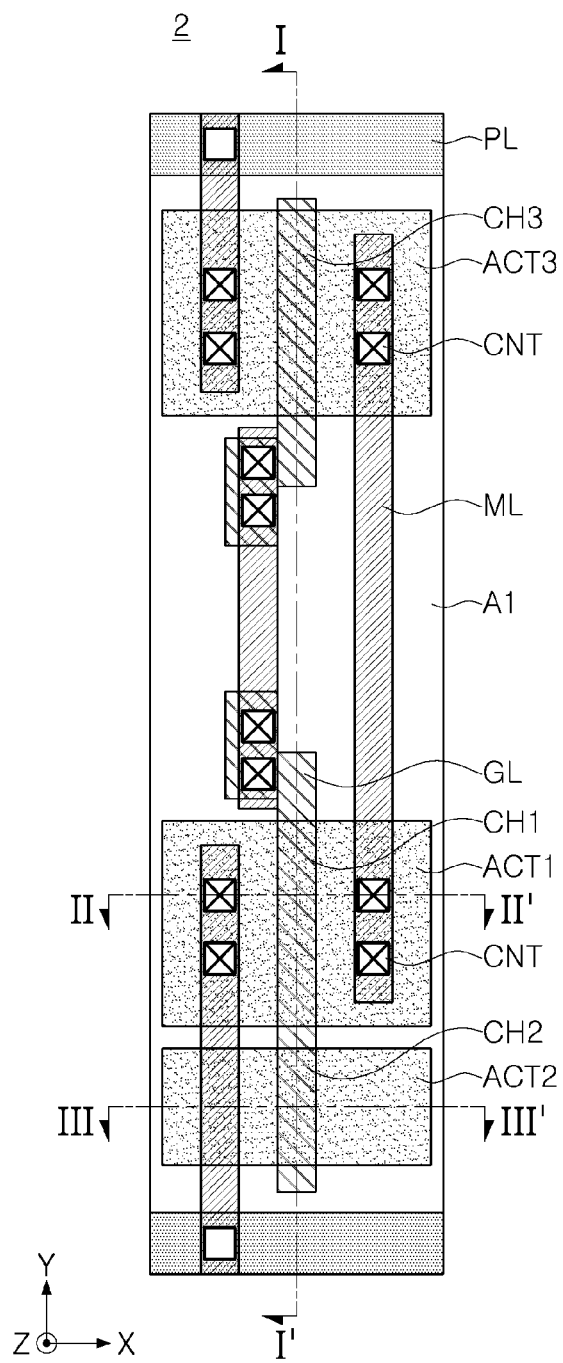
FIG. 2 is a layout diagram of a semiconductor device according to an embodiment of the present inventive concept.
Figure 3:
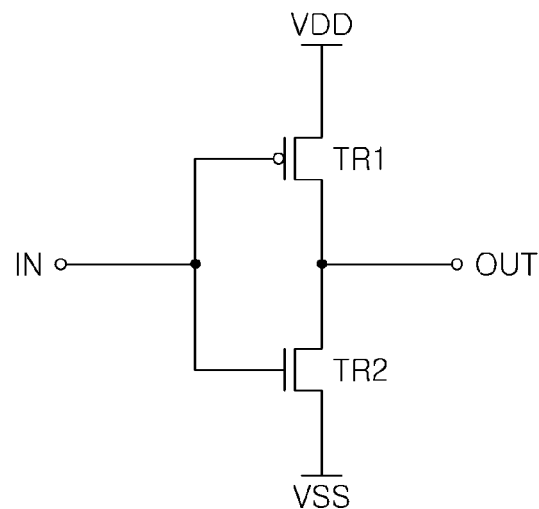
FIG. 3 is a circuit diagram schematically illustrating a semiconductor device according to an embodiment of the present inventive concept.

FIG. 2 is a layout diagram of a semiconductor device according to an embodiment of the present inventive concept, and FIG. 3 is a circuit diagram schematically illustrating a semiconductor device according to an embodiment of the present inventive concept.

In general, whether or not an antenna device is attached, whether damage of a transistor due to plasma damage in a process of manufacturing a semiconductor chip can be prevented, may be determined according to an area of a channel region of the transistor and an area of a metal wiring connected thereto. For example, according to the Antenna Rule, when a ratio of the sum of areas of metal wirings to the sum of areas of channel regions is not within an allowed value, an antenna device may be disposed in the semiconductor device. For example, a ratio of the sum of areas of metal wirings (e.g., an area occupied by the metal wirings, from a plan view, such as an area of top surfaces of the metal wirings) to the sum of areas of channel regions (e.g., from a plan view) may be defined as an antenna ratio (A/R). Antenna devices arranged according to the Antenna Rule may emit accumulated plasma charges. When there is no antenna device, a defect may occur in the semiconductor device.

The sum of areas respectively included in a denominator and a numerator of the antenna ratio may be calculated based on an electrically connected network. For example, the sum of areas of metal wirings may be calculated by summing areas of the electrically connected network, assuming that a process has progressed to a target layer of which the antenna ratio is measured. For example, if a layer has levels of M0, M1, M2, and the like in sequence starting from the lowest level, when a level of a target layer of which the antenna ratio is measured is M0, the sum of areas of metal wirings may be the sum of areas of metal wirings having levels of M0 or less. When a level of a target layer of which the antenna ratio is measured is M1, the sum of areas of metal wirings may be the sum of areas of metal wirings having levels of M1 or less. In this case, a metal wiring having a level of M0 may be included. However, a value used to calculate the sum of areas of metal wirings is not limited to areas of metal wirings arranged on respective levels, but may include, for example, areas of contacts for connecting metal wirings of respective layers in addition to the sum of areas of metal wirings.

FIG. 2 is a view illustrating a semiconductor device 2 providing an additional transistor, instead of an antenna device AD, in order to address the issue of the semiconductor device 1 including the antenna device AD, illustrated in FIG. 1. Referring to FIG. 2, a semiconductor device 2 according to an embodiment of the present inventive concept does not use a second region A2 additionally, as compared to the semiconductor device 1 using the antenna device AD. An additional transistor may be provided in an empty space of a first region A1. Similarly to the semiconductor device 1 illustrated in FIG. 1, a semiconductor device 2 according to an embodiment of the present inventive concept may include a gate line GL, a first active region ACT1, a third active region ACT3, a plurality of lower metal wirings ML, and a plurality of contacts CNT. Compared to the semiconductor device 1, a semiconductor device 2 according to an embodiment of the present inventive concept may be characterized in that a length of which the gate line GL extends may be different, a second active region ACT2 overlapping the extended gate line GL is further included, and a second region including an antenna device is not used as described above. In a semiconductor device 2 according to an embodiment of the present inventive concept, the plurality of lower metal wirings ML may be disposed in a layer having a level of M0, and power lines PL may be disposed in a layer having a level of M1.

Referring to FIG. 3, a semiconductor device 2 according to an embodiment of the present inventive concept may include an inverter. The inverter may include one (1) PMOS transistor TR1 and one (1) NMOS transistor TR2, and the transistors TR1 and TR2 may be arranged in series between a power supply voltage VDD and a ground voltage VSS. Gates of each of the transistors TR1 and TR2 included in the inverter may be connected to each other, to provide an input node IN. Ones of source/drain regions of each of the transistors TR1 and TR2 included in the inverter may be connected to each other, to provide an output node OUT. The inverter may invert an input signal, input to the input node IN, and may output the inverted signal to the output node OUT. However, this is only illustrative and the present disclosure is not limited thereto. A semiconductor device 2 according to an embodiment of the present inventive concept may include a component to protect a transistor from plasma damage.

Referring to FIGS. 2 and 3 together, a semiconductor device 2 according to an embodiment of the present inventive concept may include a first channel region CH1 overlapping the gate line GL and the first active region ACT1, and a third channel region CH3 overlapping the gate line GL and the third active region ACT3. The term "semiconductor device" may be used to describe an individual semiconductor component, such as an inverter, or a transistor, or may be used to describe more generally an integrated circuit of a semiconductor chip, formed on a die and including a plurality of components. For example, the semiconductor device 2 may provide a plurality of first transistors and a plurality of third transistors, that include first channel regions CH1 and third channel regions CH3, respectively. For example, the plurality of first transistors and the plurality of third transistors may include general transistors related to an operation of the semiconductor device 2. For example, the plurality of first transistors may each be a PMOS transistor TR1, and the plurality of third transistors may each be an NMOS transistor TR2. In a process of manufacturing the semiconductor device 2, transistors may be damaged by plasma damage, and the semiconductor device 2 may include a configuration for preventing defects of a semiconductor chip on which the semiconductor device 2 is formed.

A semiconductor device 2 according to an embodiment of the present inventive concept may use the gate line GL and the second active region ACT2 while maintaining the lower metal wiring ML, which may be difficult to adjust a size thereof, as it is, to additionally provide a second channel region CH2. The second channel region CH2, additionally provided, may increase the sum of areas of channel regions, and may decrease an antenna ratio therebetween. For example, by reducing the antenna ratio, the transistor may be protected from plasma damage without an antenna device. For example, in a semiconductor device 2 according to an embodiment of the present inventive concept, by adding the second channel region CH2, the antenna ratio may have a value of about 0.4 or more and 400 or less (e.g., between 0.4 and 400, depending on whether only one or a plurality of levels of the metal wirings are being used to compute the ratio). However, this is only illustrative and the present disclosure is not limited thereto. The antenna ratio may vary depending on an area of the second channel region CH2, further added, and/or a layout of the semiconductor device 2. As can be seen, a semiconductor device 2 according to an embodiment of the present inventive concept does not require an antenna device to be disposed. Therefore, a size of the semiconductor chip may increase, and a degree of freedom in arranging the lower metal wiring ML may be improved.

In some embodiments, the second channel region CH2 is a region in which at least a portion of the gate line GL, extending in the first direction, and the second active region ACT2 overlap. The second active region ACT2 may be disposed to be spaced apart from the active areas ACT1 and ACT3 in the first direction, and may be disposed in the empty space of the first region A1. Among active regions, the second active region ACT2 may be adjacent to the first active region ACT1 in the first direction. Therefore, unlike the semiconductor device 1 including the antenna device AD, illustrated in FIG. 1, that required the second region A2 for arranging the antenna device AD, an antenna ratio itself may be improved without an additional area, to protect a transistor from plasma damage.

In a semiconductor device 2 according to an embodiment of the present inventive concept, the active regions ACT1 and ACT3 may include an impurity doped with different conductivity-types, respectively, formed in a semiconductor layer. For example, the first active region ACT1 may include a first conductivity-type impurity, and the third active region ACT3 may include a second conductivity-type impurity, different from the first conductivity-type impurity. The second active region ACT2 may include the same first conductivity-type impurities as a first active region ACT1 adjacent thereto. For example, the first conductivity-type may be N-type, and the second conductivity-type may be P-type. However, this is only illustrative and the present disclosure is not limited thereto. The impurity included in the second active region ACT2 may have a different conductivity-type, depending on a position in which the second active region ACT2 is provided.

A source/drain region may be formed on the second active region ACT2, added, similarly to the first and third active regions ACT1 and ACT3. However, the source/drain region formed on the second active region ACT2 may be floated, and for example not connected to any wiring layer. For example, in one embodiment, an electrical signal as well as a power voltage or a ground voltage are not applied to the source/drain region formed in the second active region ACT2. For example, the plurality of lower metal wirings ML may be electrically separated and insulated from the second active region ACT2. At least one of the plurality of lower metal wirings ML may be directly electrically connected to the first active region ACT1. In addition, a semiconductor device 2 according to an embodiment of the present inventive concept may apply a signal to the gate line GL through at least one of the plurality of lower metal wirings ML. As used herein, components described as being "electrically connected" are configured such that an electrical signal can be transferred from one component to the other (although such electrical signal may be attenuated in strength as it transferred and may be selectively transferred). Moreover, components that are "directly electrically connected" share a common electrical node through electrical connections by one or more conductors, such as, for example, wires, pads, internal electrical lines, through vias, etc. As such, directly electrically connected components do not include components electrically connected through active elements, such as transistors or diodes.

In a semiconductor device 2 according to an embodiment of the present inventive concept, the second channel region CH2 added based on the second active region ACT2 may be a channel region of a second transistor. As the source/drain regions of the second active region ACT2 are floated, the second transistor may operate as a dummy transistor having a dummy active region (e.g., the second active region ACT2), and therefore does not transfer signals to or from other components. Therefore, the semiconductor device 2 may include an active transistor (which does communicate with other components), and a dummy transistor (which does not communicate with other components). However, this is only illustrative and the present disclosure is not limited thereto. Structural features of the second active region ACT2 and the source/drain regions, as well as structural features of the gate line GL and the second channel region CH2 may also vary. A description of embodiments having various features will be described later.

Figure 4:
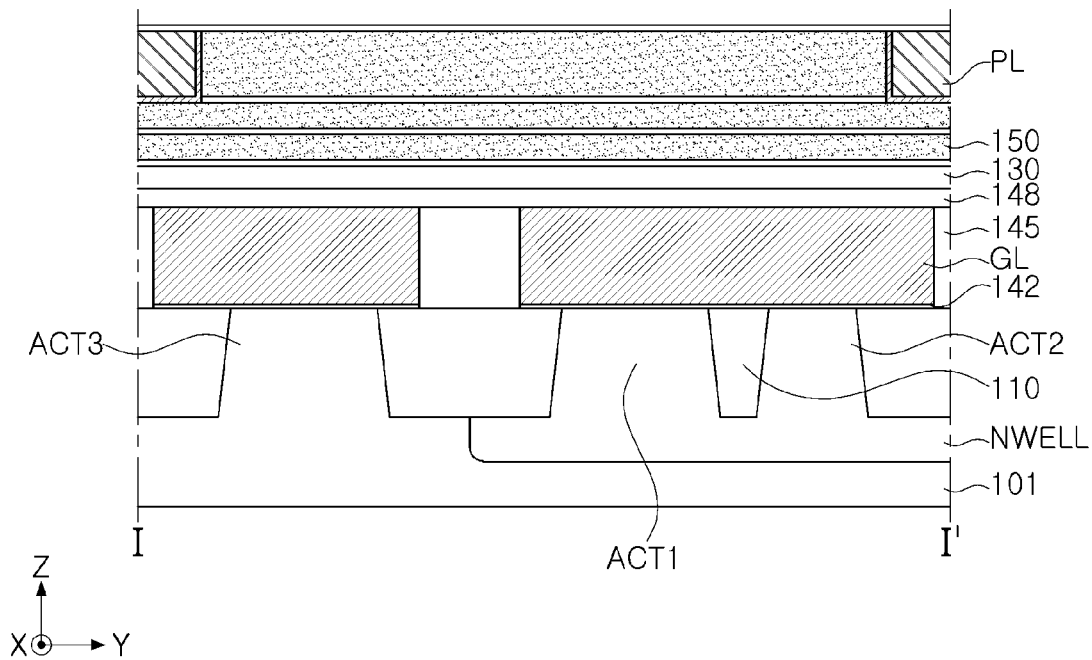
FIGS. 4 to 6 are cross-sectional views illustrating a semiconductor device according to an embodiment of the present inventive concept.
Figure 5:
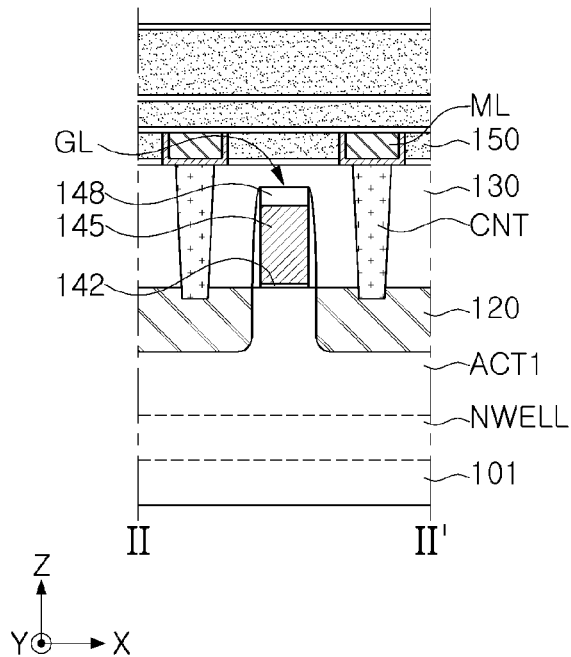
Figure 6:
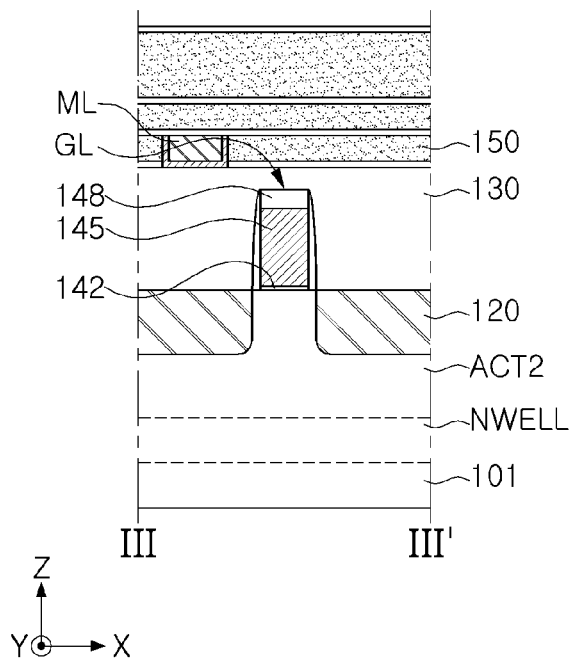

FIGS. 4 to 6 are cross-sectional views illustrating a semiconductor device according to an embodiment of the present inventive concept.

For example, FIGS. 4 to 6 illustrate cross-sections of the semiconductor device 2, taken along cutting lines I-I', and of FIG. 2, respectively. For convenience of description, only main components of the semiconductor device 2 are illustrated in FIGS. 4 to 6. For example, although a layer having a level of M1 is illustrated in FIGS. 4 to 6, it is not limited thereto. In addition, an arrangement of the illustrated main components and metal wirings is only illustrative and the present disclosure is not limited thereto.

Referring to FIGS. 4 to 5, a semiconductor device 100 according to an embodiment of the present inventive concept may include a substrate 101, active regions ACT1, ACT2, and ACT3, a device isolation layer 110, source/drain regions 120, a lower interlayer insulating layer 130, a gate insulating layer 142, a gate electrode layer 145, a gate capping layer 148, an upper interlayer insulating layer 150, a plurality of contacts CNT, and a plurality of metal wirings ML. For example, the plurality of contacts CNT may include an active contact, a gate contact, a lower via, or the like. A cross-section of the gate line GL may include the gate insulating layer 142, the gate electrode layer 145, and the gate capping layer 148. However, this is only illustrative and the present disclosure is not limited thereto. A configuration of the semiconductor device 100 and a configuration of the gate line GL included therein may be different than illustrated.

The substrate 101 may have an upper surface extending in the X and Y directions. The substrate 101 may include or may be a semiconductor material, such as a group IV semiconductor, a group III-V compound semiconductor, or a group II-VI compound semiconductor. For example, the group IV semiconductor may include or may be silicon, germanium, or silicon-germanium. The substrate 101 may be provided as a bulk wafer, an epitaxial layer, a silicon-on-insulator (SOI) layer, or a semiconductor-on-insulator (SeOI) layer. The substrate 101 may include doped regions such as an N well region NWELL.

The device isolation layer 110 may define the active regions ACT1, ACT2, and ACT3 in the substrate 101. The device isolation layer 110 may be formed by, for example, a shallow trench isolation (STI) process. As illustrated in FIG. 4, the device isolation layer 110 may include a region extending deeper in a lower portion of the substrate 101 between adjacent active regions ACT1, ACT2, and ACT3, but is not limited thereto. The device isolation layer 110 may be formed of an insulating material, and may be or include, for example, oxide, nitride, or a combination thereof.

The active regions ACT1, ACT2, and ACT3 may be defined by the device isolation layer 110 in the substrate 101, and may be disposed to extend in the second direction, for example, in the X direction. The source/drain regions 120 may be disposed on the active regions ACT1, ACT2, and ACT3 on both sides of the gate line GL. Depending on embodiments, the active regions ACT1, ACT2, and ACT3 may have doped regions including impurities. For example, the active regions ACT1, ACT2, and ACT3 may include impurities diffused from the source/drain regions 120 in a region contacting the source/drain regions 120. The active regions ACT1, ACT2, and ACT3 are not limited to a structure having a flat upper surface, as illustrated.

The source/drain regions 120 may be formed of an epitaxial layer, and may include or be formed of, for example, silicon (Si), silicon germanium (SiGe), or silicon carbide (SiC). Also, the source/drain regions 120 may further include impurities such as arsenic (As) and/or phosphorus (P). In embodiments, the source/drain regions 120 may include a plurality of regions including elements having different concentrations and/or doping elements.

The gate line GL may be disposed above the active regions ACT1, ACT2, and ACT3 to overlap the active regions ACT1, ACT2, and ACT3, and extend in the Y direction. Channel regions of respective transistors may be provided in the active regions ACT1, ACT2, and ACT3 overlapping the gate line GL. A cross-section of the gate line GL may include the gate insulating layer 142, the gate electrode layer 145, gate spacer layers, and the gate capping layer 148. However, a shape and a configuration of the gate line GL included in the respective transistors are not limited as illustrated.

For example, the gate insulating layer 142 may be provided as a plurality of layers or may be disposed to extend onto a lateral surface of the gate electrode layer 145. The gate insulating layer 142 may be or include oxide, nitride, or a high-k material. The high-k material may mean a dielectric material having a dielectric constant, higher than a dielectric constant of a silicon oxide layer ($SiO_2$). The gate line GL may be formed of two conductive portions, for example, each extending lengthwise in the first direction (Y direction), where the two conductive portions are separated by an insulation layer or block formed therebetween.

The gate electrode layer 145 may include or may be a conductive material, for example, a metal nitride such as a titanium nitride film (TiN), a tantalum nitride film (TaN), or a tungsten nitride film (WN), and/or a metal material such as aluminum (Al), tungsten (W), or molybdenum (Mo), or a semiconductor material such as doped polysilicon. The gate electrode layer 145 may be formed of two or more multiple layers. The gate electrode layer 145 may be disposed separately from each other in the Y direction between at least some adjacent transistors according to a circuit of the semiconductor device 100. For example, the gate electrode layer 145 may be separated by a separate gate separation layer (e.g., forming the insulation layer or block).

The gate spacer layers may be disposed on both lateral surfaces of the gate electrode layer 145. The gate spacer layers may insulate the source/drain regions 120 and the gate electrode layer 145. The gate spacer layers may be provided as a multilayer structure according to embodiments. The gate spacer layers may be formed of oxide, nitride, or oxynitride, and in particular, may be formed of a low-k film. The gate spacer layers may include or be formed of, for example, at least one of SiO, SiN, SiCN, SiOC, SiON, or SiOCN.

The gate capping layer 148 may be disposed on the gate electrode layer 145, and lower and lateral surfaces of the gate capping layer 148 may be surrounded by the gate electrode layer 145 and the gate spacer layers, respectively. The gate capping layer 148 may be formed of, for example, oxide, nitride, or oxynitride.

The lower interlayer insulating layer 130 may be disposed to cover the source/drain regions 120 and the gate line GL. The lower interlayer insulating layer 130 may include or be formed of, for example, at least one of oxide, nitride, or oxynitride, and may include a low-k material.

The plurality of contacts CNT may pass through the lower interlayer insulating layer 130 to be connected to the source/drain regions 120, or may pass through the lower interlayer insulating layer 130 and the gate capping layer 148 to be connected to the gate electrode layer 145, and may apply an electric signal to the source/drain regions 120 and the gate electrode layer 145. The plurality of contacts CNT may be disposed to extend into a recess the source/drain regions 120 to a predetermined depth, but they are not limited thereto. The plurality of contacts CNT may include or be formed of a conductive material, for example, a metal material such as tungsten (W), aluminum (Al), copper (Cu), or the like, or a semiconductor material such as doped polysilicon. According to some embodiments, the plurality of contacts CNT may include a barrier metal layer disposed on an outer surface thereof. Also, according to some embodiments, the plurality of contacts CNT may further include a metal-semiconductor layer such as a silicide layer disposed on an interface contacting the source/drain regions 120 and the gate electrode layer 145.

The upper interlayer insulating layer 150 may cover the plurality of contacts CNT, and may be disposed on the same level as a lower via and the plurality of metal wirings ML. The upper interlayer insulating layer 150 may include first to third insulating layers having different levels. The upper interlayer insulating layer 150 may be formed of silicon oxide or a low-k material. The upper interlayer insulating layer 150 may include, for example, at least one of SiO, SiN, SiCN, SiOC, SiON, or SiOCN. Etch stop layers for stopping etching in an etching process for forming the lower via and the plurality of metal wirings ML may be disposed on a lower surface of each of the upper interlayer insulating layers 150. The etch stop layers may include a high-k material, and may include, for example, silicon nitride or aluminum oxide.

The semiconductor device 100 illustrated in FIGS. 4 to 5 are illustrated up to a layer having a level of M1, but the semiconductor device 100 is not limited thereto. For example, the semiconductor device 100 may include a lower via, first wiring lines, first vias, second wiring lines, or the like, which may be stacked and disposed in sequence from a lower portion of the semiconductor device 100. The first wiring lines and the second wiring lines, stacked in sequence from the lower portion to an upper portion of the semiconductor device 100, may have a relatively large thickness toward the upper portion, but they are not limited thereto. Each of the wiring structures may include a conductive material. For example, each of the wiring structures may include or may be at least one of aluminum (Al), copper (Cu), or tungsten (W).

Referring to FIG. 6, in a semiconductor device 100 according to an embodiment of the present inventive concept, a cross-section of the second active region ACT2 may have a shape different from a shape of the first active region ACT1. For example, as shown in FIG. 6, an active contact is not disposed above the second active region ACT2. For example, the second active region ACT2 may be a floating region. However, this is only illustrative and the present disclosure is not limited thereto. A floating active contact may be disposed above the second active region ACT2 according to some embodiments.

As can be seen in FIG. 6 as well as in the embodiments shown in the later figures, each depicted semiconductor device includes a second active region ACT2 that overlaps in the first direction (e.g., Y direction) with the first active region ACT1 and the third active region ACT3. In addition, each second active region ACT2 is formed to have a width (or length) in the second direction (e.g., X direction) that is the same as or less than a width in the second direction of each of the first active region ACT1 and third active region ACT3. Furthermore, in each example, the second active region ACT2 vertically overlaps (e.g., from a top-down view, or in the Z direction) at least part of a gate line GL. In each example, a gate line GL extends in the first direction (e.g., Y direction) to vertically overlap both the first active region ACT1 and the second active region ACT2. In addition, in various embodiments, a length of the second active region ACT2 in the first direction (e.g., Y direction) is shorter than a length of either of the first active region ACT1 or the third active region ACT3 in the first direction. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

FIGS. 7 to 21 are layout diagrams of semiconductor devices according to embodiments of the present inventive concept.

Effects of semiconductor devices according to embodiments of the present inventive concept may be determined by an area of a second channel region CH2. For example, an area of a second channel region CH2 may be different from an area of a first channel region CH1. For example, the area of the second channel region CH2 may be smaller than the area of the first channel region CH1. However, this is only illustrative and is not limited as such. The area of the second channel region CH2 may be determined by a shape of an extended gate line GL, a shape of a second active region ACT2, and a shape of a portion of the second channel region CH2 in which the extended gate line GL and the second active region ACT2 overlap (e.g., in the Z direction). The shape of the extended gate line GL, the shape of the second active region ACT2, and the shape of a portion of the second channel region CH2 in which the extended gate line GL and the second active region ACT2 overlap are not limited to those illustrated in FIG. 2, and may have various structures (e.g., sizes, shapes, and/or layouts). For example, the second channel region CH2 may have various structures such as a triangle, and other shapes as well as a rectangle.

FIGS. 7 to 21 are views illustrating various types of embodiments.

Figure 7:
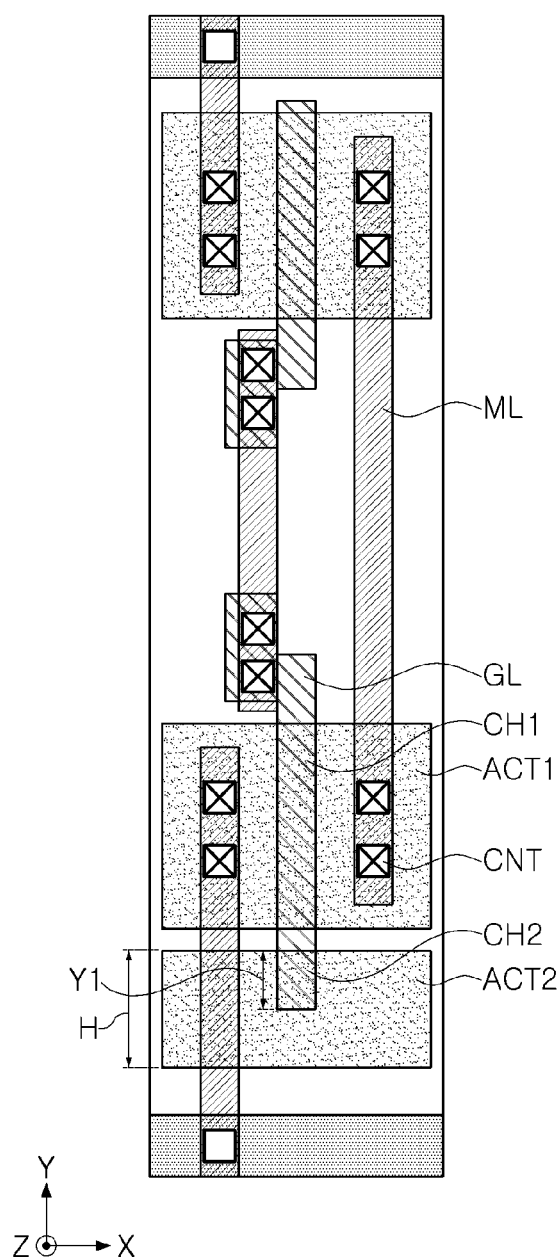
FIGS. 7 to 21 are layout diagrams of semiconductor devices according to embodiments of the present inventive concept.
Figure 8:
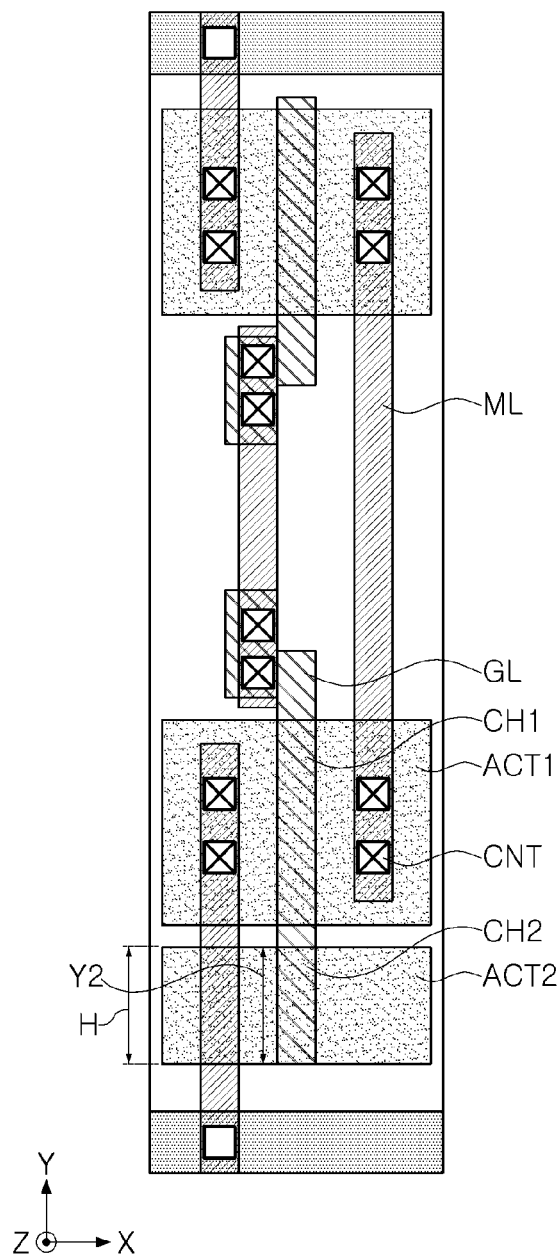

First, referring to FIGS. 7 and 8, in semiconductor devices 3 and 4 according to embodiments of the present inventive concept, a length of an extended gate line GL may not be limited to a particular length. For example, the gate line GL included in the semiconductor device 2 illustrated in FIG. 2 may extend further in the first direction than a lower end of the second active region ACT2, additionally added. The gate line GL included in the semiconductor devices 3 and 4 illustrated in FIGS. 7 and 8 may extend to a degree that does not reach a lower end of a second active region ACT2, or may extend to the lower end of the second active region ACT2, in the first direction. In this case, a boundary of the extended gate line GL may be a boundary of a second channel region CH2. For example, with respect to the same second active region ACT2, when the gate line GL extends to pass through the lower end of the second active region ACT2, as in the semiconductor device 2 illustrated in FIG. 2, or when the gate line GL extends onto the lower end of the second active region ACT2, as in the semiconductor device 4 illustrated in FIG. 8, an area of the second channel region CH2 may be maximized. When the area of the second channel region CH2 is maximized, an antenna ratio of the semiconductor device may be minimized. Therefore, a transistor included in the semiconductor devices may be protected from plasma damage even without a typical antenna device.

For example, in the semiconductor devices 3 and 4 illustrated in FIGS. 7 and 8, a length of the second active region ACT2 in the first direction may be H. A length of the second channel region CH2 illustrated in FIG. 7 in a first direction may be Y1, and a length of the second channel region CH2 illustrated in FIGS. 2 and 8 may be Y2. For example, Y1 may have a value smaller than H, and Y2 may be substantially the same as H.

Figure 9:
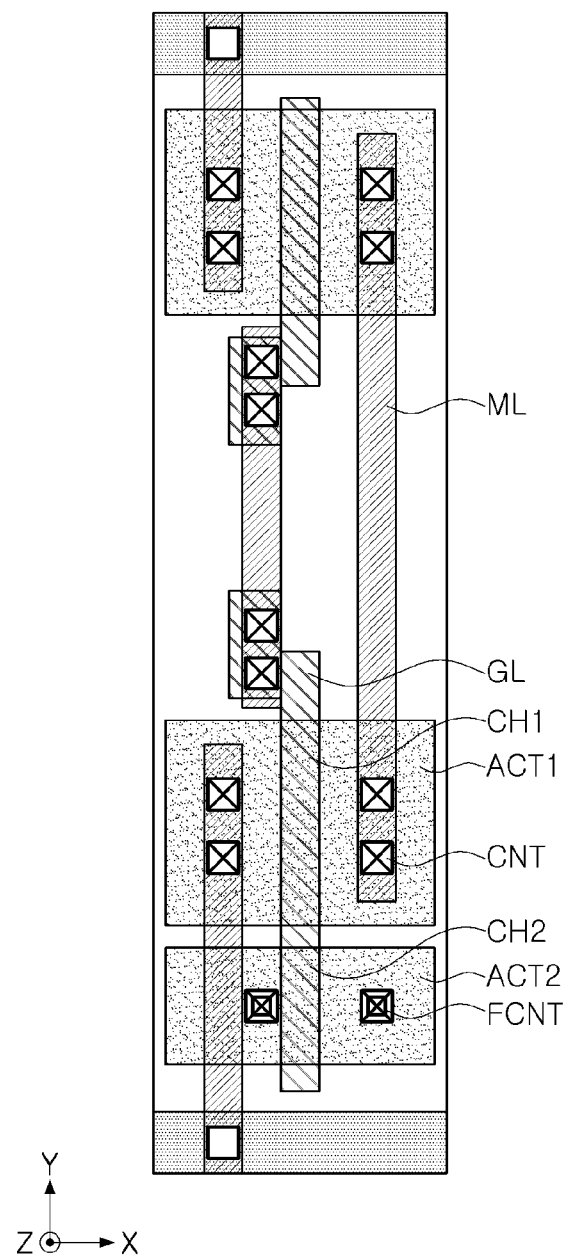
Figure 10:
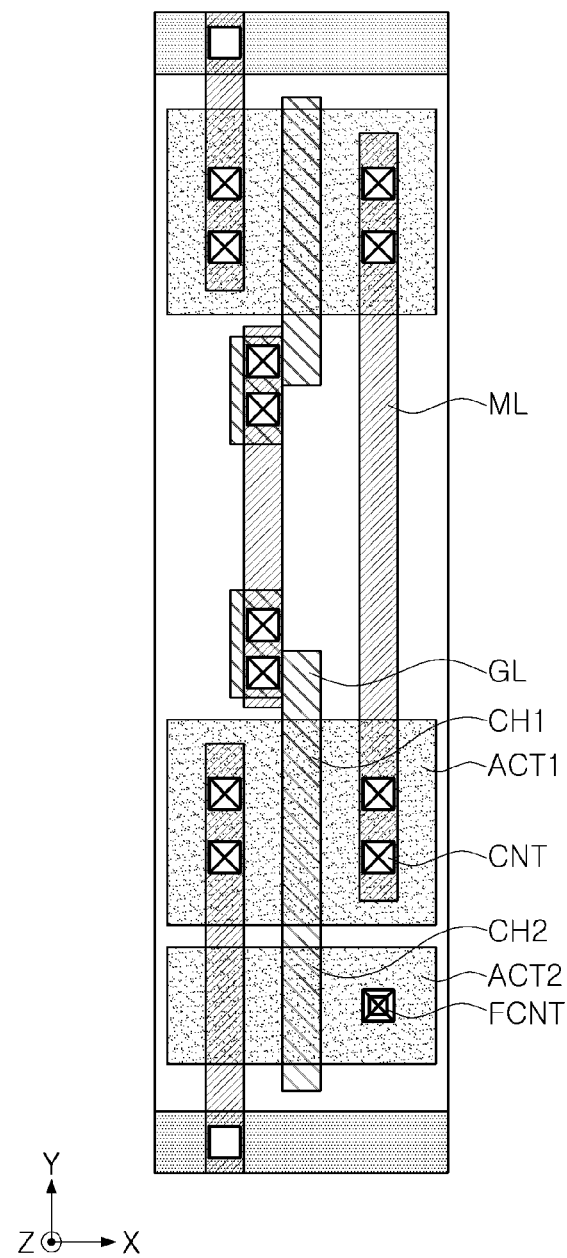

As described above, the plurality of contacts CNT may be disposed above the first active region ACT1 and the third active region ACT3, to apply a signal to the source/drain regions of the first and third active regions ACT1 and ACT3, respectively. The plurality of contacts CNT may include an active contact and a lower via. Referring to FIGS. 9 and 10, at least one floating contact FCNT having a shape, for example identical to a shape of an active contact, may be disposed in lateral upper portions of a second active region ACT2 with reference to a gate line GL. For example, a source/drain region may be formed in a portion of the second active region ACT2, and a floated active contact may be disposed above at least one of the source/drain regions. The floating contact FCNT may be electrically separated from a plurality of lower metal wirings ML (and from any metal wirings). However, an arrangement and a shape of the floating contact FCNT in the semiconductor devices 5 and 6, illustrated in FIGS. 9 and 10, are only illustrative and embodiments are not limited thereto. Also, floating contacts such as shown in FIGS. 9 and 10 can be included in the various other embodiments disclosed herein.

The presence or absence of the floating contact FCNT may be determined in consideration of convenience for a process of the semiconductor devices and/or an arrangement with other components. For example, when including contacts does not cause a problem such as the second active region ACT2 being connected to the lower metal wiring ML due to contact, a contact may be disposed above the second active region ACT2 without distinction from the first active region ACT1. In this case, the contact disposed above the second active region ACT2 may be a floating contact FCNT. When including contacts would cause a problem such as that the second active region ACT2 being connected to the lower metal wiring ML due to contact, a contact may not be disposed above at least a portion of the second active region ACT2.

A size and a shape of the second channel region CH2 may be different from a size and a shape of each of the plurality of first and third channel regions CH1 and CH3. For example, an area, or a length in the Y direction of the second channel region CH2 may be different from (e.g., larger or smaller than) an area, or length in the Y direction of the first or third channel regions CH1 or CH3. A size and a shape of the second channel region CH2 may be determined by a shape of the extended gate line GL and/or an extension direction of the gate line GL, or the like. FIGS. 11 to 18 are views illustrating embodiments related to an extension shape and an extension direction of a gate line GL. The gate line GL may basically extend in the first direction. However, the present inventive concept is not limited thereto. The gate line GL may also extend in a region overlapping a second active region ACT2 in the second direction. Also, the gate line GL may extend in a third direction including both the first direction and the second direction. Further, a second channel region CH2 is not limited to the illustrated embodiments, as long as the second channel region CH2 is provided separately from (e.g., to be separated from) the first channel region CH1, based on a floated second active region ACT2.

Referring to FIGS. 11 to 14, a gate line GL included in semiconductor devices 7 to 10 according to embodiments of the present inventive concept may extend in various shapes. For example, at least a portion of the gate line GL may have a first channel region CH1 and a second channel region CH2, having different lengths in the second direction. For example, a length of the first channel region CH1 in the second direction may be W. In the semiconductor devices 7 to 10 illustrated in FIGS. 11 to 14, lengths of the gate line GL included in the second channel region CH2 at any one point therein in the second direction may be W1, W2, W3, and W4, respectively. A length of an extended gate line GL in the second direction may be determined in consideration of processing conditions and an arrangement with other components.

Figure 11:
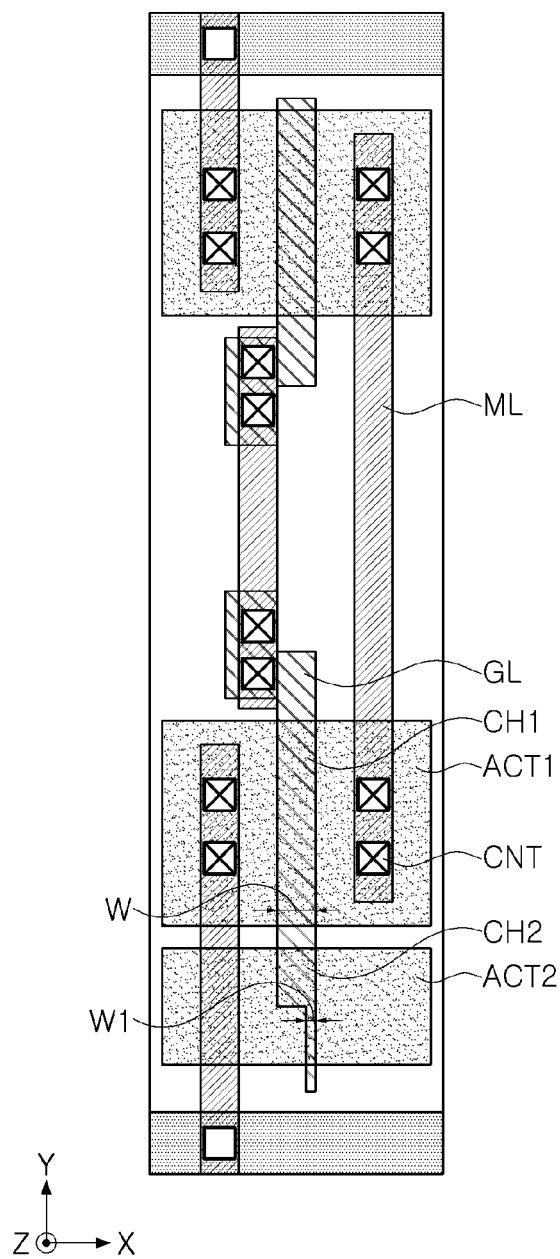

Referring to FIG. 11, in a semiconductor device 7 according to an embodiment of the present inventive concept, a length of an extended gate line GL in the second direction may decrease. For example, the length W1 at a point of the second channel region CH2 in the second direction may be a value smaller than the length W of the first channel region CH1 in the second direction. As illustrated in FIG. 11, lengths at different points of the second channel region CH2 in the second direction may have values other than W1. However, this is only illustrative and the present disclosure is not limited thereto.

Figure 12:
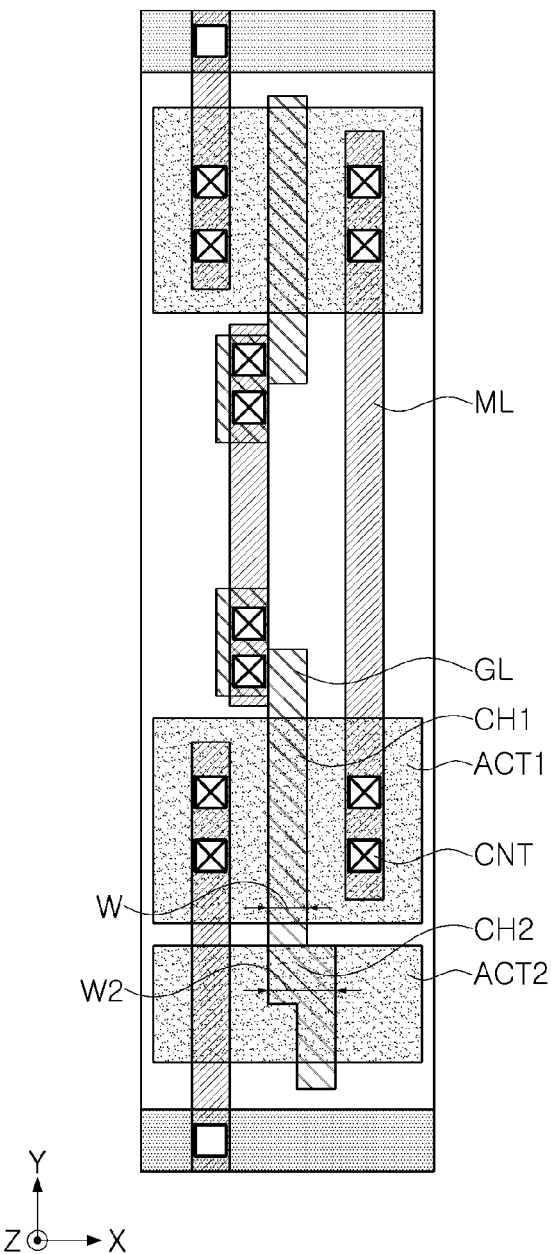
Figure 13:
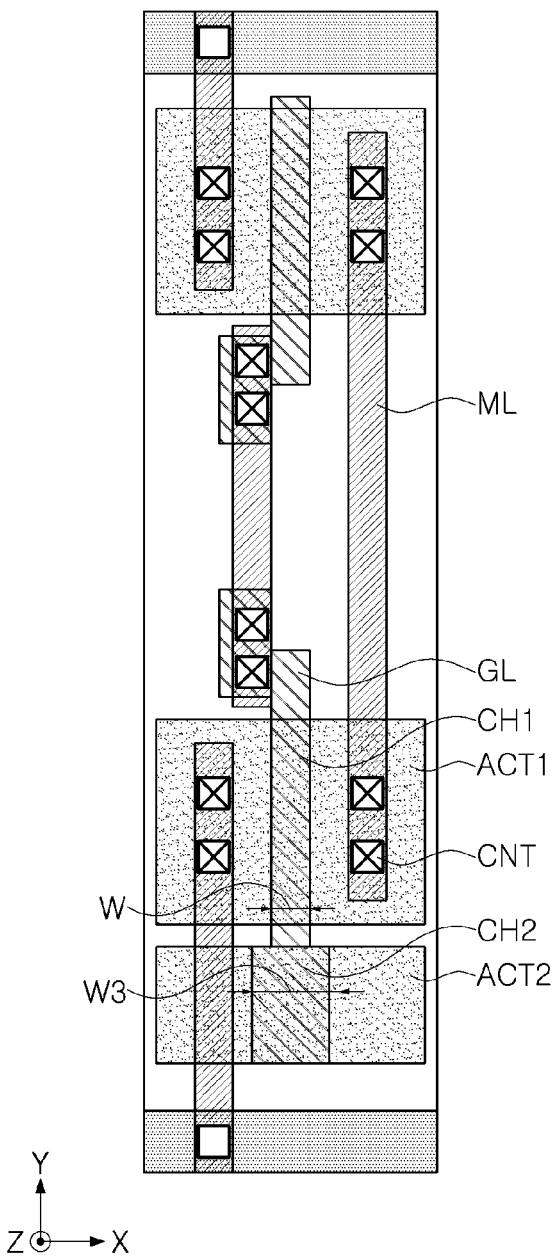

Referring to FIGS. 12 and 13, in semiconductor devices 8 and 9 according to an embodiment of the present inventive concept, a length of an extended gate line GL in the second direction may increase. For example, the lengths W2 and W3 at a point in the second channel region CH2 in the second direction may be values larger than the length W of the first channel region CH1 in the second direction. As illustrated in FIG. 12, lengths at different points of the second channel region CH2 in the second direction may have values other than W2. In addition, as illustrated in FIG. 13, a length of a gate line GL extending entirely over the second channel region CH2 in the second direction may be W3.

Figure 14:
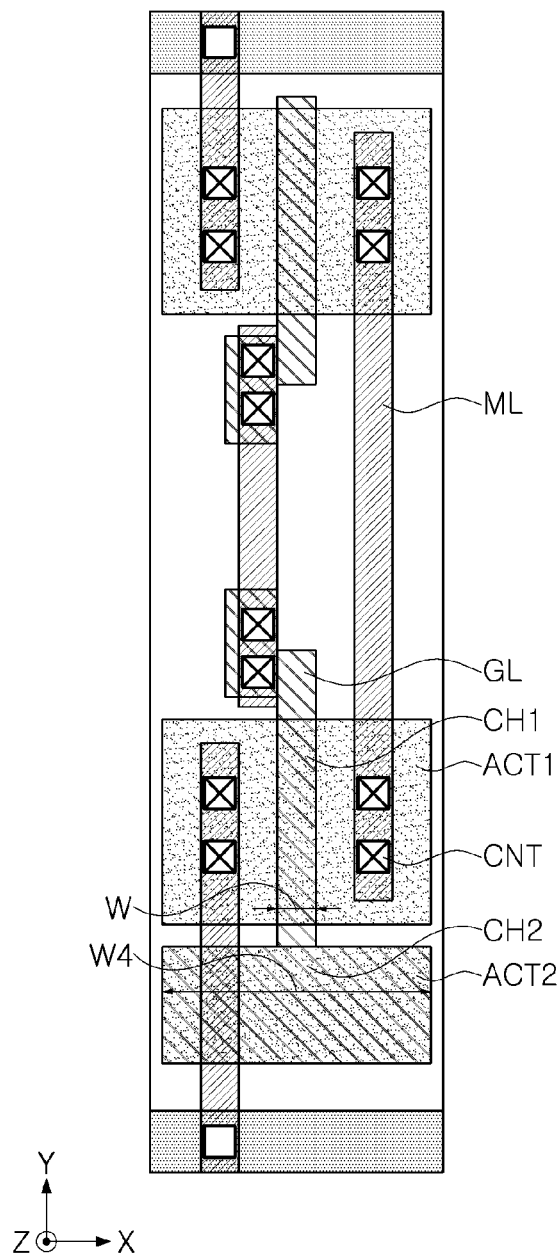

Further, referring to FIG. 14, in a semiconductor device 10 according to an embodiment of the present inventive concept, an extended gate line GL may have a length, identical to a length of a second active region ACT2, in the second direction. In this case, the length of the extended gate line GL in the second direction and the length of the second active region ACT2 in the second direction may be the same, such as W4. For example, an area of the second channel region CH2 may be the same as an area of the second active region ACT2. The area of the second channel region CH2 may be maximized using the extended gate line GL according to an embodiment, but this is only illustrative and the present disclosure is not limited thereto. A shape of the gate line GL may be determined in consideration of an overall layout of the semiconductor device.

Referring to FIGS. 15 to 18, an extension direction of a gate line GL included in semiconductor devices 11 to 14 according to embodiments of the present inventive concept may not be limited to those examples. For example, at least a portion of the gate line GL may extend in a direction, other than the first direction. For example, at least a portion of the gate line GL above a second channel region CH2 may extend in one direction, different from the first and second directions and parallel to an upper surface of a semiconductor substrate. For example, an extended gate line GL may have a diagonal shape, when the X and Y directions are taken as axes. Using the gate line GL extending to have the diagonal shape, semiconductor devices 11 to 14 according to embodiments of the present inventive concept may improve a degree of freedom in arranging a lower metal wiring ML. However, the semiconductor devices 11 to 14 of FIGS. 15 to 18 related to the extension direction of the gate line GL are only illustrative and are not limited thereto.

Figure 15:
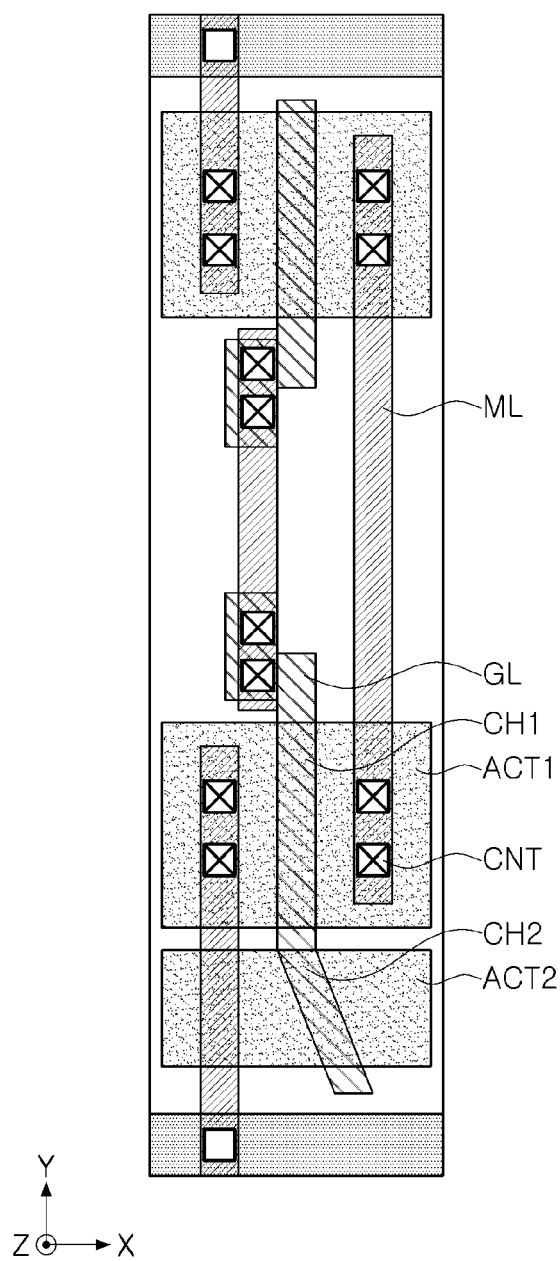
Figure 16:
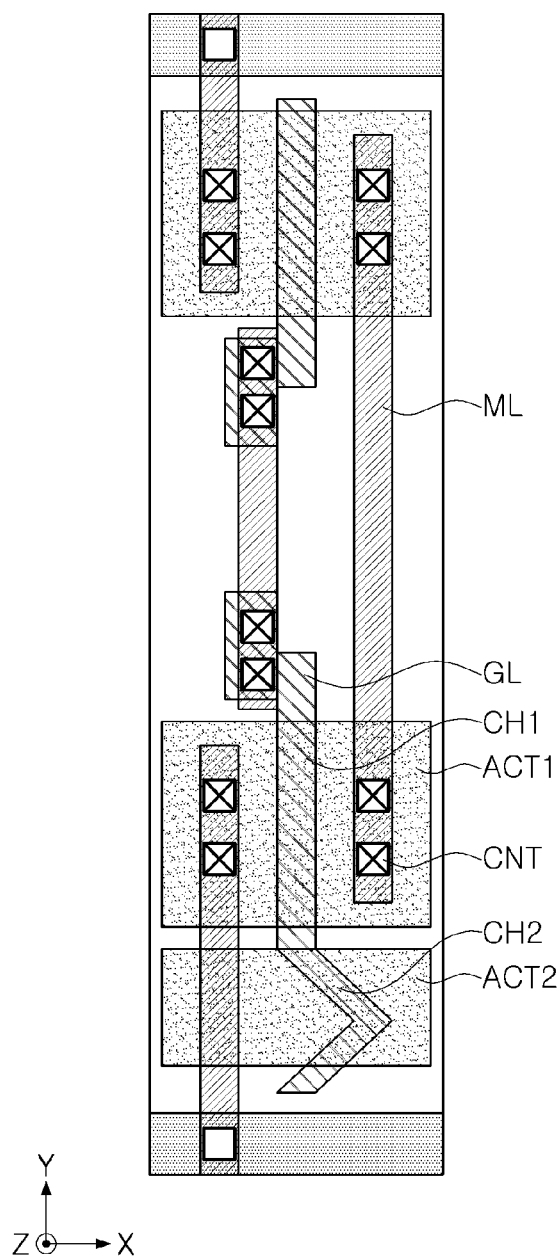

Referring to FIG. 15, in a semiconductor device 11 according to an embodiment of the present inventive concept, a gate line GL may extend in a predetermined direction. As in a semiconductor device 12 illustrated in FIG. 16, an extension direction of the gate line GL may change during extension. For example, the gate line GL extending in a predetermined direction in a portion thereof overlapping the second active region ACT2 may further extend in a direction, different from the predetermined direction.

Figure 17:
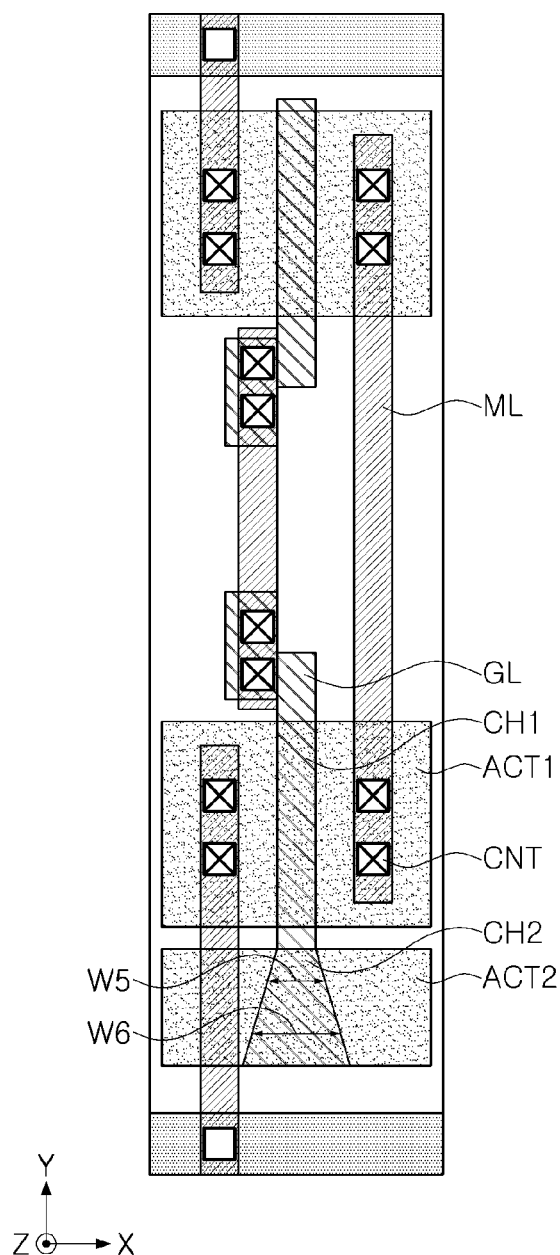

Also, according to embodiments, the gate line GL may extend to have a diagonal shape while changing a length in the second direction. Referring to FIG. 17, in a semiconductor device 13 according to an embodiment of the present inventive concept, a gate line GL may extend to gradually increase a length in the second direction. For example, a gate line GL above a second channel region CH2 may include a first region having a first width and a second region having a second width, different from the first width, in the second direction. For example, the first width may be W5, the second width may be W6, and W5 may be a value smaller than W6. This may form a tapered shape, such as a trapezoid shape, from a plan view.

Figure 18:
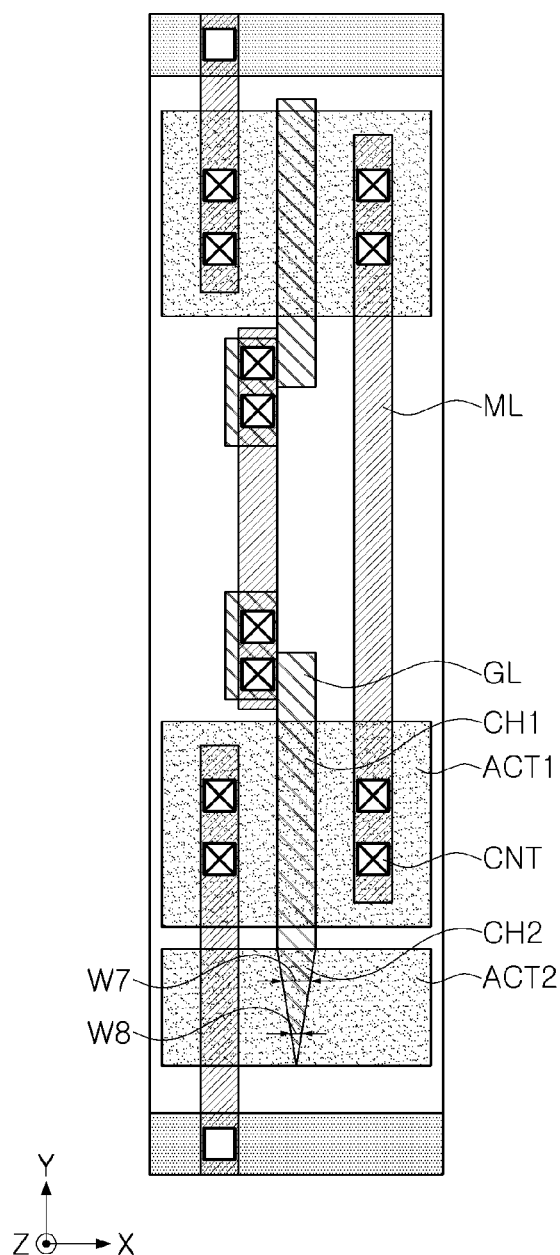

Referring to FIG. 18, in a semiconductor device 14 according to an embodiment of the present inventive concept, a gate line GL may extend to gradually decrease a length in the second direction. For example, a gate line GL above a second channel region CH2 may include a first region having a first width and a second region having a second width, different from the first width, in the second direction. For example, the first width may be W7, the second width may be W8, and W7 may be a value greater than W8. However, the semiconductor devices 13 and 14 illustrated in FIGS. 17 and 18 are only illustrative and are not limited thereto. The lengths of the gate lines GL in the second direction may vary in various ways according to embodiments.

Figure 19:
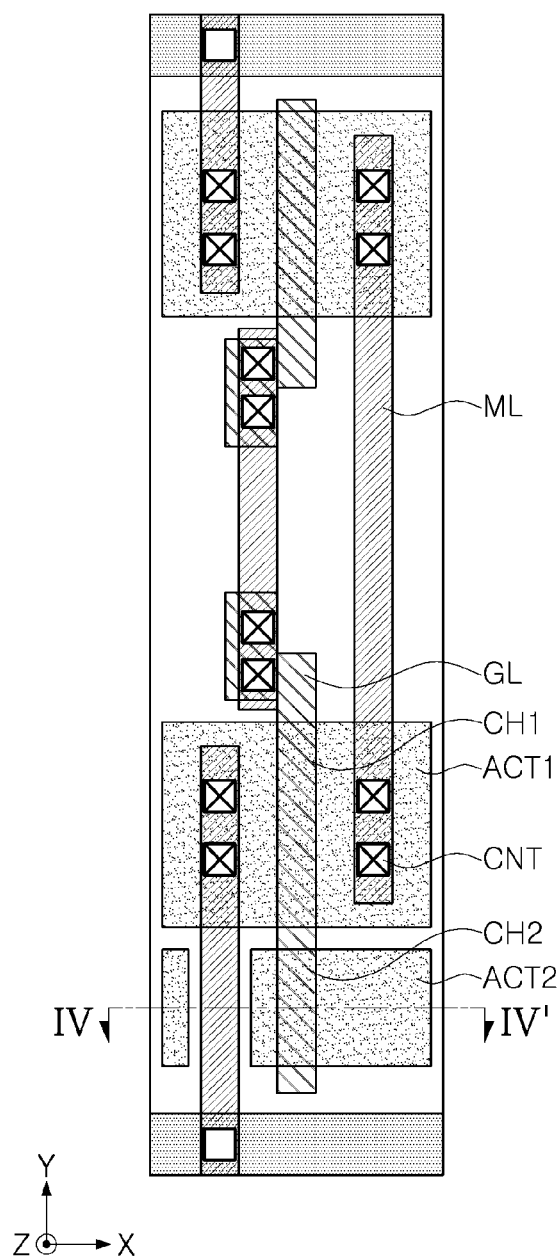
Figure 20:
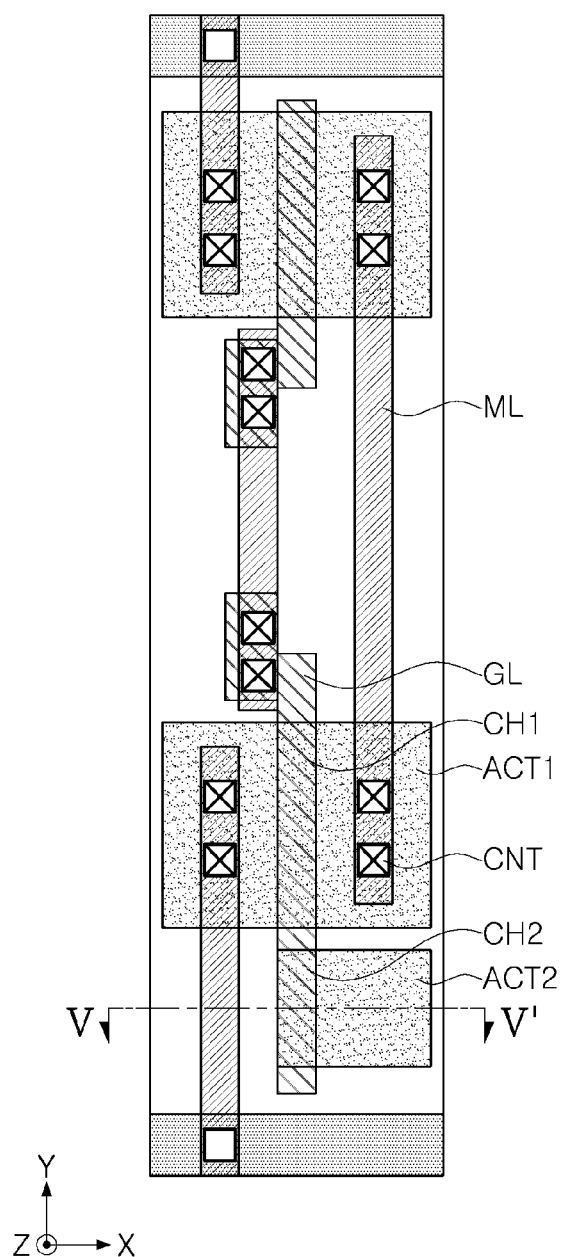
Figure 21:
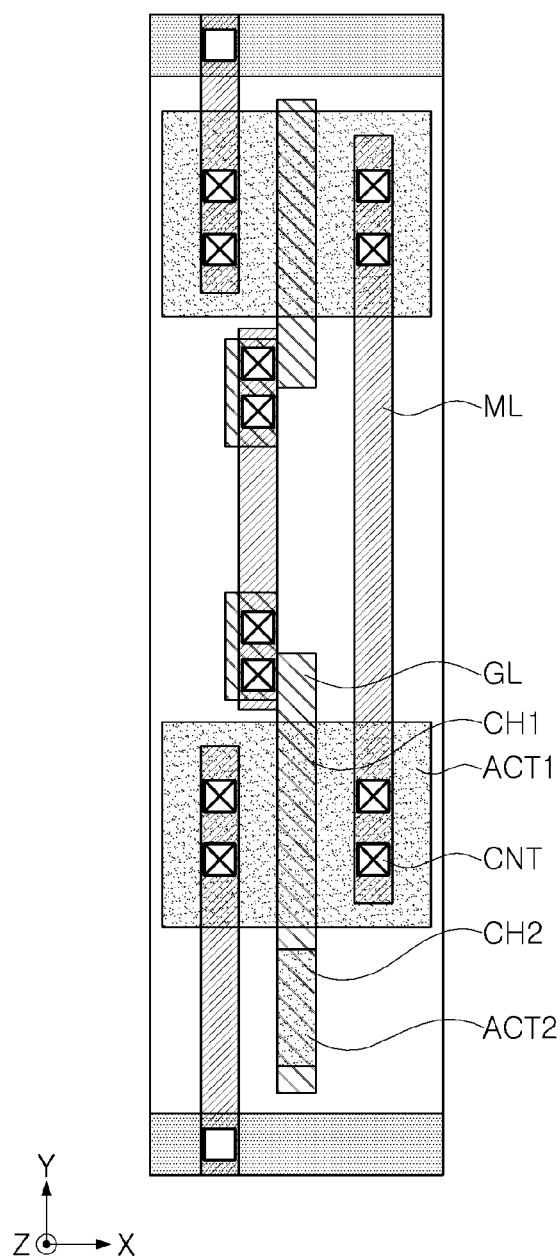

Referring to FIGS. 19 to 21, a size of a second active region ACT2 included in semiconductor devices according to embodiments may vary. The size of the second active region ACT2 may be determined in consideration of relationship between a process and surrounding components. According to embodiments, the size of the second active region ACT2 may determine a size of a second channel region CH2. Semiconductor devices 15, 16, and 17 according to embodiments of the present inventive concept may include gate lines GL extending to have the same shape by the same length. For example, the gate lines GL included in the semiconductor devices 15, 16, and 17, respectively, may be substantially the same as the gate line GL included in the semiconductor device 2 illustrated in FIG. 2 (though the gate size and shape from the other previously-mentioned embodiments may be used as an alternative). Further, the semiconductor devices 15, 16, and 17 and the semiconductor device 2 illustrated in FIG. 2 may include second channel regions CH2 having substantially the same area and shape.

Referring to FIGS. 19 to 21, lengths of second active regions ACT2 included in the semiconductor devices 15, 16, and 17 according to embodiments of the present inventive concept in the second direction may be different from lengths of first active regions ACT1 included therein, respectively. For example, a length of the second active region ACT2 may be less than a length of the first active region ACT1, in the second direction. In the second direction, a portion in which the second active region ACT2 is not provided may be a region separated by an STI process. For example, a portion in which the second active region ACT2 is not provided may be defined as an STI region.

In the semiconductor device 15 illustrated in FIG. 19, an STI process may be performed in the second active region ACT2 provided below a lower metal wiring. For example, the lower metal wiring may be disposed on an STI region. For example, the second active region ACT2 may not overlap the lower metal wiring in the Z direction, perpendicular to an upper surface of a semiconductor substrate. As such, the STI process may be performed in consideration of an arrangement between the floated second active region ACT2 and other components. An STI region formed by the STI process may divide the second active region ACT2 into a plurality of regions. However, this is only illustrative and the present disclosure is not limited thereto. According to embodiments, the second active region ACT2 may be one region of which a length in the second direction is reduced, and the lower metal wiring may not be disposed above the STI region.

For example, the semiconductor device 16 illustrated in FIG. 20 may include an STI region having a length, greater than the semiconductor device 15 illustrated in FIG. 19, in the second direction. Therefore, the second active region ACT2 included in the semiconductor device 15 may include one region of which a length in the second direction is reduced by the STI region. In addition, the semiconductor device 17 illustrated in FIG. 21 may include STI regions in the second active regions ACT2, respectively formed on upper surfaces of both sides of an extended gate line GL. In this case, a lower metal wiring may not be disposed above any one of the STI regions. For example, lengths of the second active region ACT2 and the gate line GL in the second direction may be substantially the same.

Figure 22:
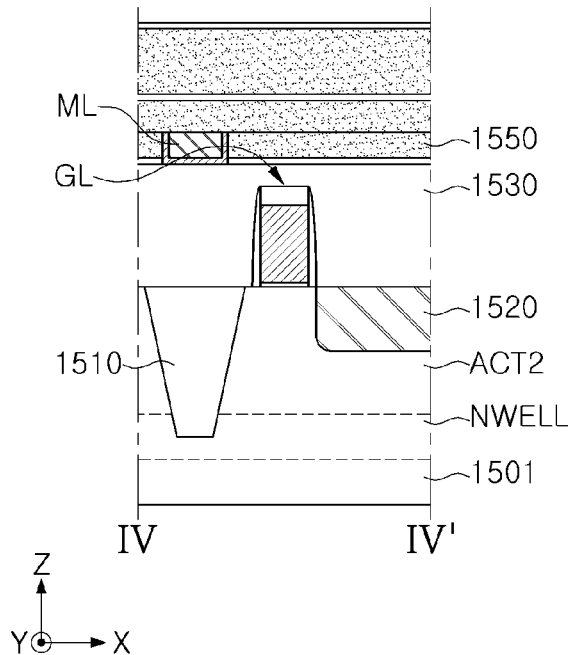
FIGS. 22 and 23 are cross-sectional views illustrating a semiconductor device according to an embodiment of the present inventive concept.
Figure 23:
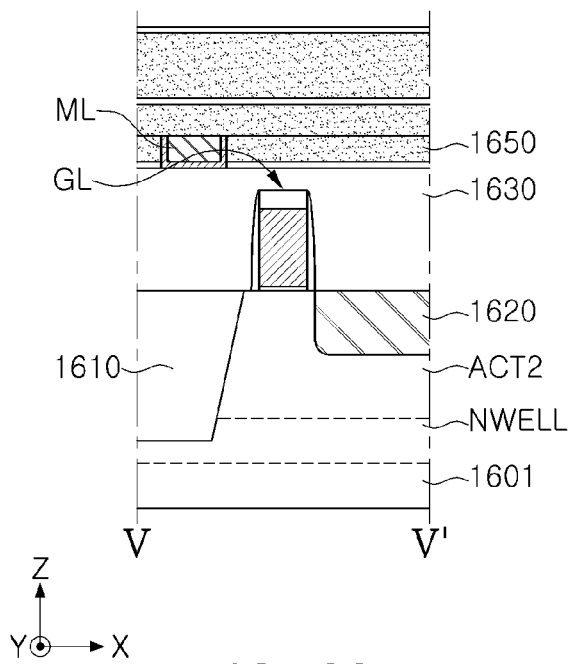

FIGS. 22 and 23 are cross-sectional views illustrating a semiconductor device according to an embodiment of the present inventive concept.

For example, FIG. 22 illustrates a cross-section of the semiconductor device 15 illustrated in FIG. 19, taken along line IV-IV', and FIG. 23 illustrates a cross-section of the semiconductor device 16 illustrated in FIG. 20, taken along line V-V'. For convenience of description, only main components of the semiconductor devices 15 and 16 are illustrated in FIGS. 22 and 23. Components omitted in the description below may respectively correspond to the components included in the semiconductor device 100 illustrated in FIG. 6. In a similar manner to FIG. 6, even though a layer having a level M1 is illustrated in FIGS. 22 and 23, the semiconductor device is not limited thereto. In addition, an arrangement of main components and metal wirings illustrated therein are only illustrative and are not limited thereto.

In semiconductor devices 1500 and 1600 according to embodiments of the present inventive concept, a second active region ACT2 may include an STI region formed on at least a portion thereof. The STI region may be device isolation layers 1510 and 1610, and source/drain regions 1520 and 1620 may be replaced with the device isolation layers 1510 and 1610 and may be filled with an insulating material. For example, in the semiconductor device 1500 according to an embodiment of the present inventive concept, illustrated in FIG. 22, the device isolation layer 1510 may be formed in a portion of the second active region ACT2. The device isolation layer 1510 may be formed to recess a portion of an N well NWELL to separate the second active region ACT2. However, this is only illustrative and the present disclosure is not limited thereto. In addition, in the semiconductor device 1600 according to an embodiment of the present inventive concept, illustrated in FIG. 23, the device isolation layer 1610 may be formed to entirely replace one lateral portion of the second active region ACT2. The device isolation layer 1610 may be formed to recess a portion of an N well NWELL to replace the second active region ACT2.

Referring to FIGS. 22 and 23, in the semiconductor devices 1500 and 1600 according to embodiments of the present inventive concept, the second active region ACT2 may not include at least a portion of the source/drain regions 1520 and 1620 due to the device isolation layers 1510 and 1610. For example, the semiconductor devices 15 and 16 illustrated in FIGS. 19 and 20 corresponding to FIGS. 22 and 23, respectively, may not include either a source region or a drain region. The semiconductor device 17 illustrated in FIG. 21 may not include all source/drain regions. However, the semiconductor devices 15, 16, and 17 illustrated in FIGS. 19 to 21 are only illustrative and are not limited, and the STI region may be formed and disposed to have various shapes. For example, the STI region included in the semiconductor device may be configured so that the second active region ACT2 does not include at least one of the source/drain regions, and the second active regions ACT2 of the semiconductor device include a source region and a drain region, having different sizes.

FIGS. 24 to 28 are layout diagrams of semiconductor devices according to embodiments of the present inventive concept.

Referring to FIGS. 24 to 28, embodiments are not limited to the semiconductor devices according to embodiments illustrated in FIGS. 7 to 21, and the like, and may be configured in various forms to include features combined with each other. For example, extended gate lines GL may extend in a diagonal shape, like the semiconductor device 7 illustrated in FIG. 11, and at the same time, floating contacts FCNT may be arranged in a portion of the second active region ACT2, as in the semiconductor device 5 illustrated in FIG. 9.

Figure 24:
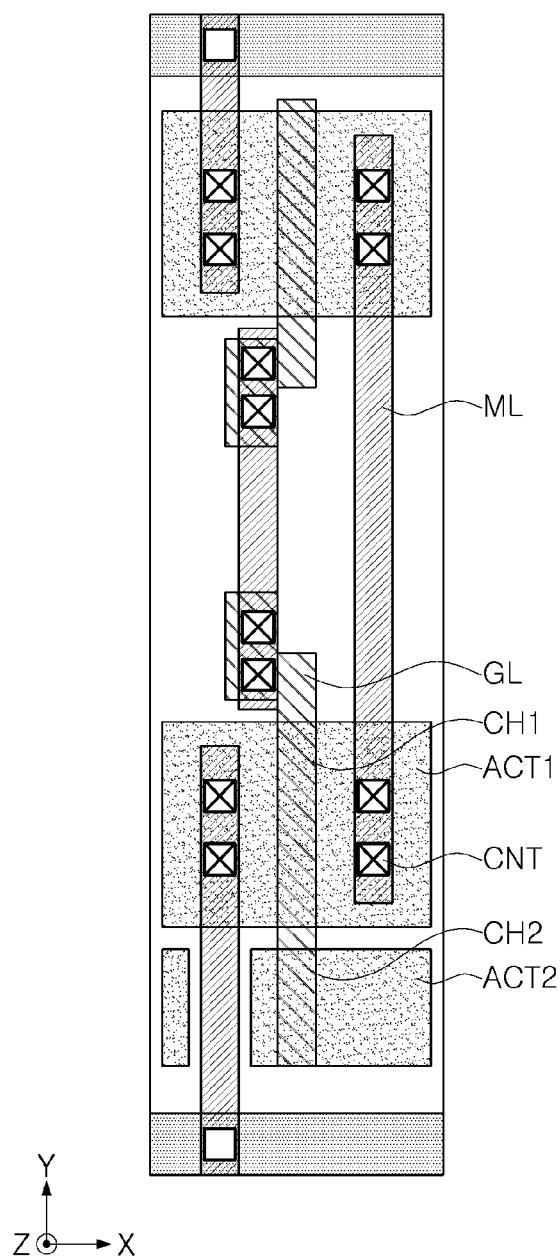
FIGS. 24 to 28 are layout diagrams of semiconductor devices according to embodiments of the present inventive concept.
Figure 25:
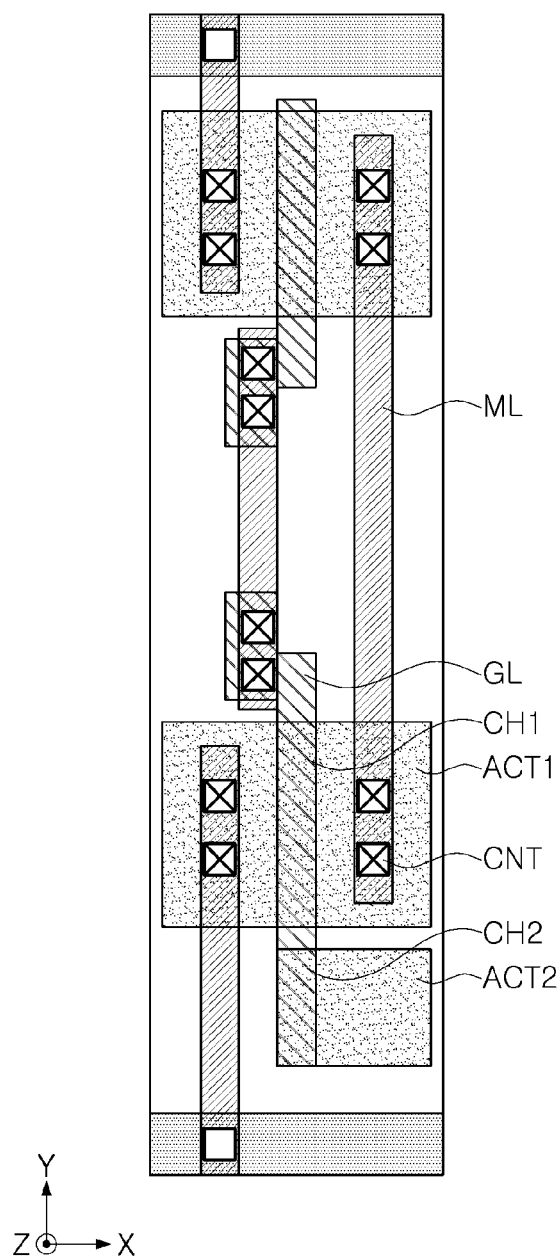
Figure 26:
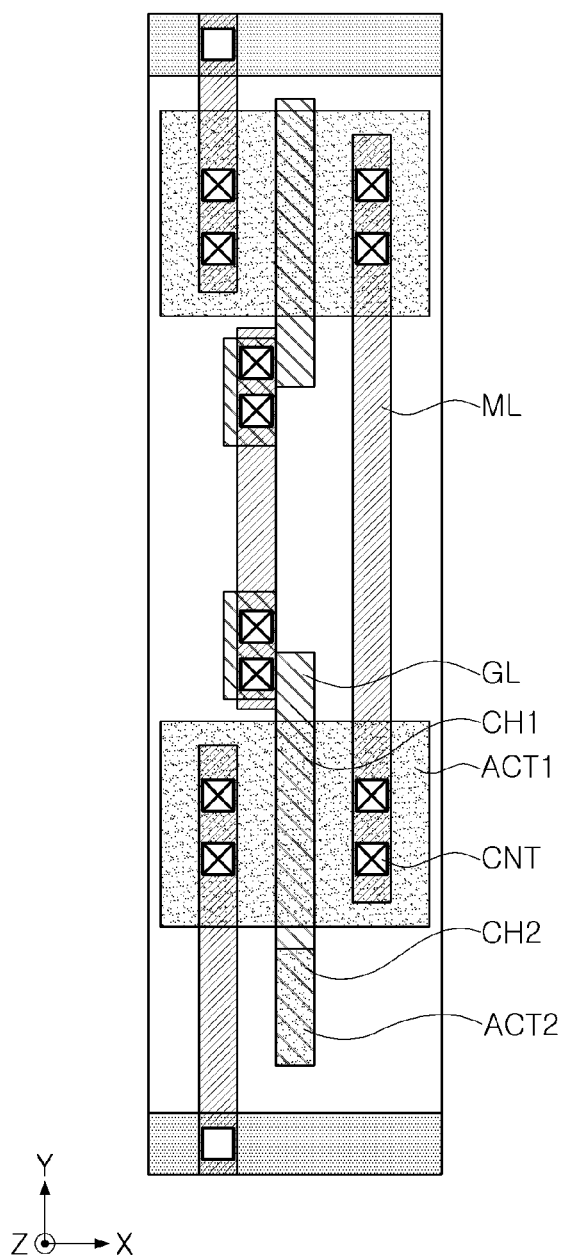

Referring to FIGS. 24 to 26, semiconductor devices 18, 19, and 20 according to embodiments of the present inventive concept may have a configuration in which features of the semiconductor devices 15, 16, and 17 illustrated in FIGS. 19 to 21, respectively, and features of the semiconductor device 4 illustrated in FIG. 8 are combined.

For example, the semiconductor device 18 illustrated in FIG. 24 may include a second active region ACT2 divided into a plurality of regions, and a gate line GL extending to a lower end of the second active region ACT2. The sum of areas of channel regions CH1 and CH2 due to a second channel region CH2 based thereon may increase.

The semiconductor device 19 illustrated in FIG. 25 may include a second active region ACT2 including one region of which a length in the second direction is reduced, and a gate line GL extending to a lower end of the second active region ACT2. The sum of areas of channel regions CH1 and CH2 due to a second channel region CH2 based thereon may increase.

The semiconductor device 20 illustrated in FIG. 26 may include a second active region ACT2 that does not include a source/drain region, and a gate line GL extending to a lower end of the second active region ACT2. The sum of areas of channel regions CH1 and CH2 due to a second channel region CH2 based thereon may increase.

Figure 27:
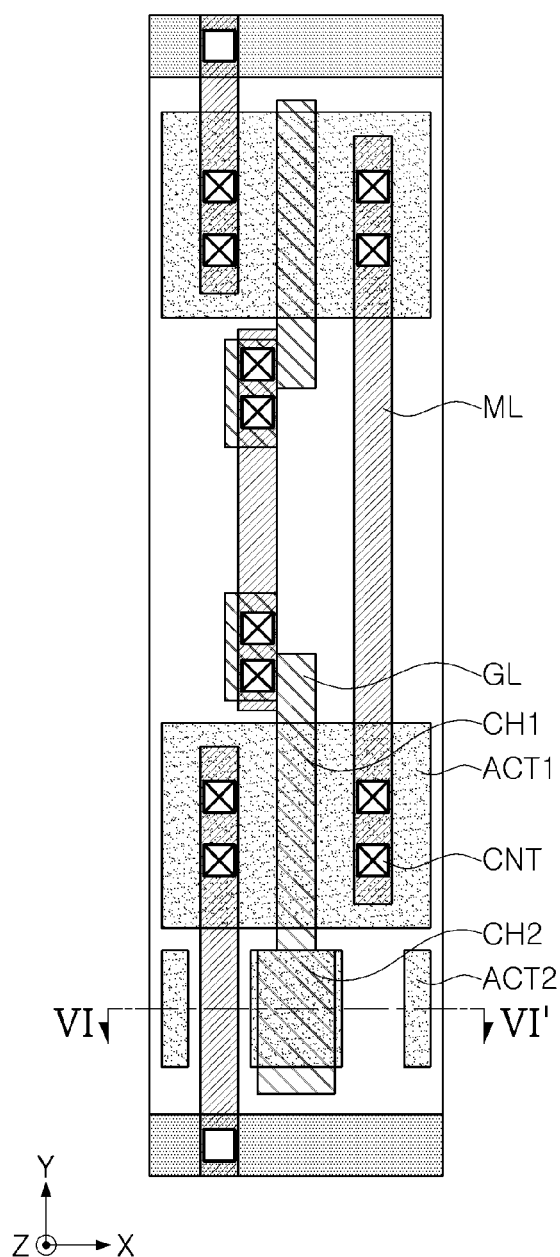

Referring to FIG. 27, a semiconductor device 21 according to an embodiment of the present inventive concept may have a configuration in which features of the semiconductor devices 9, 15, and 17 illustrated in FIGS. 13, 19, and 21 combine. For example, the semiconductor device 21 may include a second active region ACT2 that is divided into a plurality of regions and does not include a source/drain region, and a gate line GL having an increased length in the second direction and further extending than a lower end of the second active region ACT2. The sum of areas of channel regions CH1 and CH2 due to a second channel region CH2 overlapping the second active region ACT2 and the gate line GL may increase.

Figure 28:
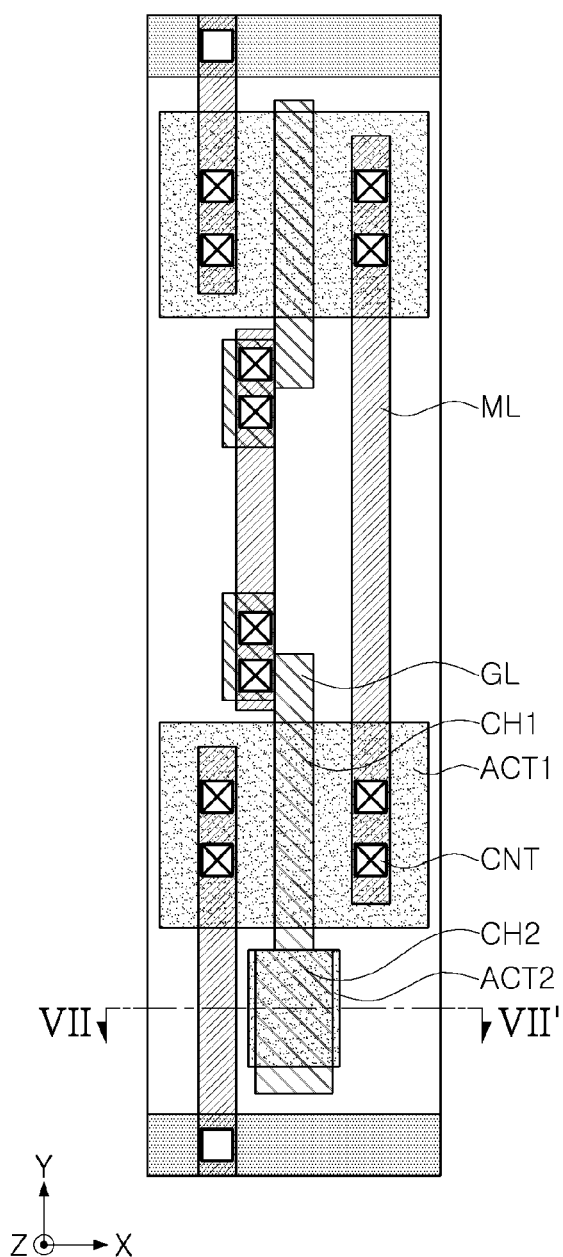

Referring to FIG. 28, a semiconductor device 22 according to an embodiment of the present inventive concept may have a configuration in which features of the semiconductor device 9 illustrated in FIG. 13 and features of the semiconductor device 17 illustrated in FIG. 21 are combined. For example, the semiconductor device 22 may include a second active region ACT2 including one region of which a length in the second direction is reduced and does not include a source/drain region, and a gate line GL having an increased length in the second direction and further extending than a lower end of the second active region ACT2. The sum of areas of channel regions CH1 and CH2 due to a second channel region CH2 overlapping the second active region ACT2 and the gate line GL may increase.

The semiconductor devices 21 and 22 illustrated in FIGS. 27 and 28 may be embodiments capable of maximizing the area of the second channel region CH2, even in consideration of an arrangement with a lower metal wiring ML. However, layouts of the semiconductor devices are not limited thereto, and may be determined in consideration of processes of manufacturing the semiconductor devices. In addition, a shape of the extended gate line GL, a shape of the added second active region ACT2, and a shape of the second channel region CH2 are not limited to the illustrated embodiments, and semiconductor devices according to embodiments of the present inventive concept may be laid out to minimize a ratio of a total area of the plurality of metal wirings and a total area of the plurality of channel regions.

Figure 29:
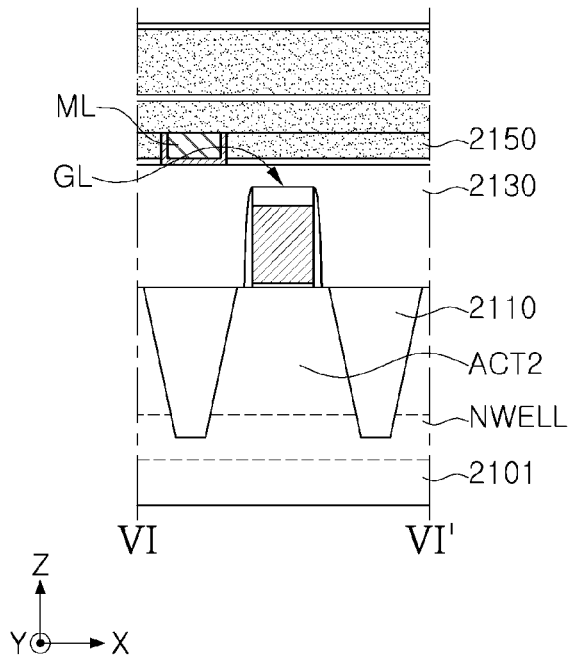
FIGS. 29 and 30 are cross-sectional views illustrating a semiconductor device according to an embodiment of the present inventive concept.
Figure 30:
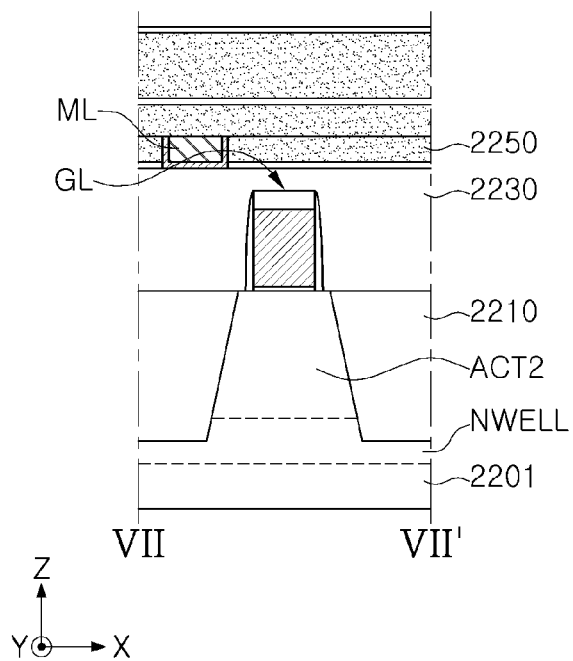

FIGS. 29 and 30 are cross-sectional views illustrating a semiconductor device according to an embodiment of the present inventive concept.

For example, FIG. 29 illustrates a cross-section of the semiconductor device 21 illustrated in FIG. 27, taken along line VI-VI', and FIG. 30 illustrates a cross-section of the semiconductor device 22 illustrated in FIG. 28, taken along line VII-VII'. For convenience of explanation, only main components of the semiconductor devices 21 and 22 are illustrated in FIGS. 29 and 30. Components omitted in the description below may respectively correspond to the components included in the semiconductor device 100 illustrated in FIG. 6. In a similar manner to FIG. 6, even a layer having a level M1 is illustrated in FIGS. 29 and 30, but is not limited thereto. In addition, an arrangement of main components and metal wirings illustrated therein are only illustrative and are not limited thereto.

In semiconductor devices 2100 and 2200 according to embodiments of the present inventive concept, a second active region ACT2 may include device isolation layers 2110 and 2210, formed on upper surfaces of both sides of a gate line GL. The device isolation layers 2110 and 2210 may include an insulating material, and may be formed in a region in which the source/drain regions of the second active region ACT2 may be formed. For example, in the semiconductor device 2100 according to an embodiment of the present inventive concept, illustrated in FIG. 29, the device isolation layer 2110 may be formed in portions of both lateral portions of the second active region ACT2. The device isolation layer 2110 may be formed to recess a portion of an N well NWELL to separate the second active region ACT2. However, this is only illustrative and the present disclosure is not limited thereto. In addition, in the semiconductor device 2200 according to an embodiment of the present inventive concept, illustrated in FIG. 30, the device isolation layer 2210 may be formed to entirely replace both lateral portions of the second active region ACT2. The device isolation layer 2210 may be formed to recess a portion of an N well NWELL to replace the second active region ACT2.

However, the semiconductor devices 2100 and 2200 illustrated in FIGS. 29 and 30 are only illustrative and are not limited, and the device isolation layers 2110 and 2210 may be formed and disposed to have various forms. For example, the device isolation layers 2110 and 2210 included in the semiconductor devices may be configured such that not only the second active region ACT2 does not include the source/drain regions, but that the second active region ACT2 of the semiconductor device includes a source region and a drain region, having different sizes.

Figure 31:
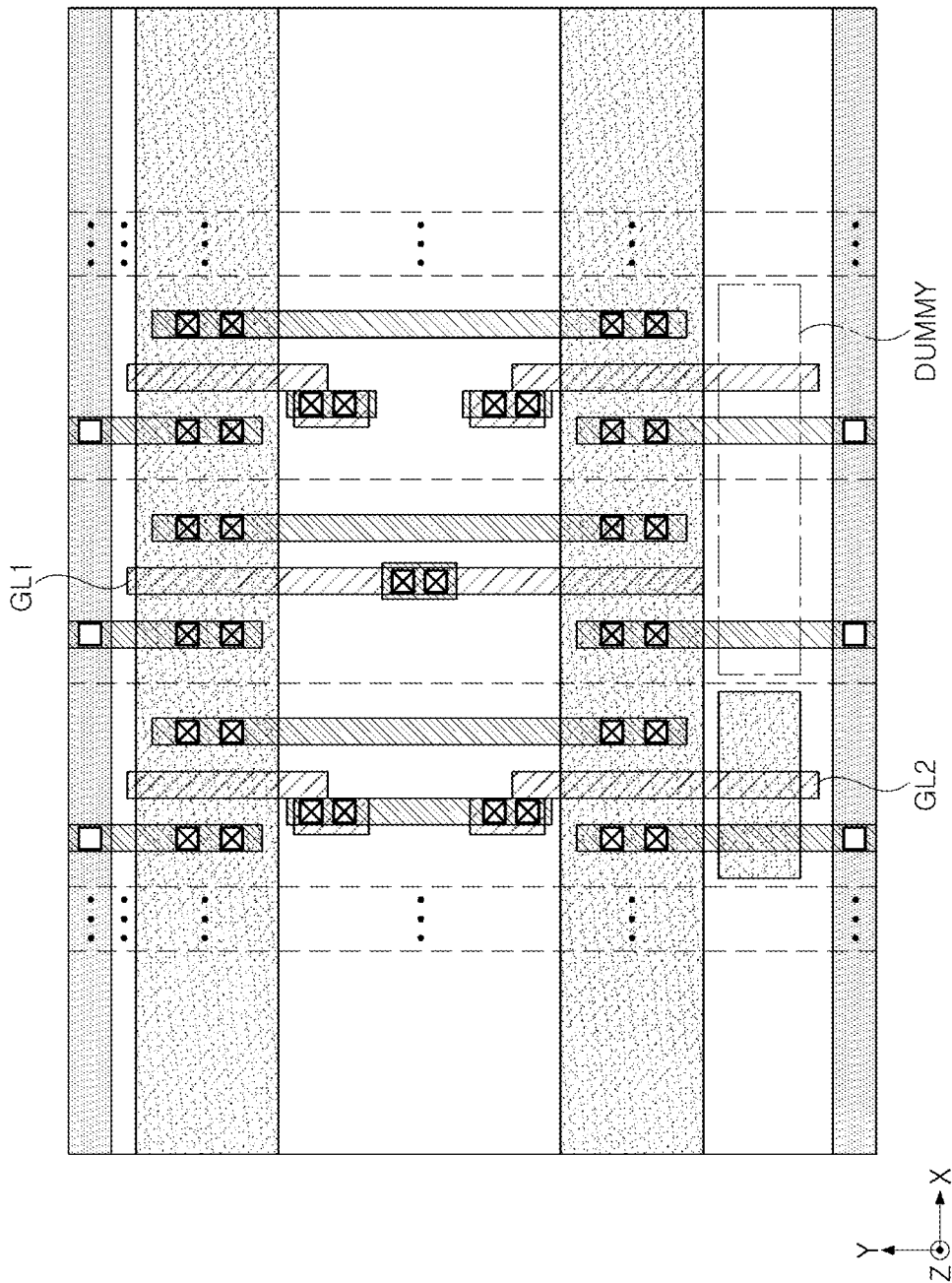
FIG. 31 is a plan view illustrating a semiconductor device according to an embodiment of the present inventive concept.

FIG. 31 is a plan view illustrating a semiconductor device according to an embodiment of the present inventive concept.

Referring to FIG. 31, a semiconductor device according to an embodiment of the present inventive concept may include a first gate line GL1 (which may be one of a plurality of first gate lines GL1), a second gate line GL2 (which may be one of a plurality of second gate lines), a plurality of active regions, a plurality of lower metal wirings, and a plurality of contacts. The plurality of first gate lines GL1 and the second gate line GL2 may extend in the first direction, and some of the gate lines may extend by different lengths (e.g., first gate lines GL1 may extend by different lengths from second gate lines GL2). Further, the plurality of first gate lines GL1 may be connected to and apply a signal to at least a portion of the plurality of lower metal wirings, or may be floated. Each second gate line GL2 and a plurality of components directly connected to the second gate line GL2 may correspond to the components included in the semiconductor device according to embodiments illustrated in FIGS. 2 to 30.

For example, a plurality of first gate lines GL1, a first active region, and a third active region may be components for general operation of a semiconductor device. A second active region provided spaced apart from the first active region in the first direction may be a floating region, and may be used to protect a transistor included in the semiconductor device from plasma damage. For example, a plurality of first gate lines GL1 may share a first active region, and at least some of the plurality of first gate lines GL1 may share the first active region with a second gate line GL2. The second active region may overlap the second gate line GL2.

For example, a second gate line GL2 may extend by a length, different from a length of a plurality of first gate lines GL1. Further, a portion of the second gate line GL2 may include a gate structure having a shape different from a shape of the plurality of first gate lines GL1. For example, in a semiconductor device according to an embodiment of the present inventive concept, a dummy region DUMMY disposed adjacent to a plurality of first gate lines GL1 in the first direction and adjacent to a second active region in the second direction may be included. The dummy region DUMMY may not provide a transistor for an operation of a general semiconductor device. However, this is only illustrative and the present disclosure is not limited thereto. Also, as discussed previously, the second active region may also be considered a dummy region.

A second gate line GL2 may provide a transistor for increasing an area of a channel region together with a transistor for general operation, and, thus, may provide the number of transistors, greater than the number of transistors in a first gate line GL1 providing only transistors for general operation. For example, a second gate line GL2 may further include a transistor provided based on a second channel region. However, this is only illustrative and the present disclosure is not limited thereto. The number of transistors provided may vary, depending on a separation state of the first gate line GL1 and the second gate line GL2.

In a semiconductor device according to an embodiment of the present inventive concept, an extended second gate line GL2 and an added second active region may be different from a semiconductor device to which an antenna device is added. For example, a ground voltage may be applied to a gate line to which an antenna device is connected, and an active region may not be floated. However, in a semiconductor device according to an embodiment of the present inventive concept, a predetermined signal, other than a ground voltage, may be applied to a second gate line GL2, and an active region may be floated.

A semiconductor device according to an embodiment of the present inventive concept may include a first active region and a second active region, respectively overlapping an extended gate region. The first active region may provide a transistor for operating the semiconductor device. The second active region may increase an area of a channel region to minimize usage of an antenna device. Therefore, problems of increasing a size of the semiconductor device and decreasing a degree of freedom of metal wiring, due to the usage of the antenna device, may be addressed.

Various advantages and effects of the present inventive concept are not limited to the above-described contents, and can be more easily understood in the course of describing specific embodiments of the present inventive concept.

While embodiments have been illustrated and described above, it will be apparent to those skilled in the art that modifications and variations could be made without departing from the scope of the present inventive concept as defined by the appended claims.

What is claimed is:

1. A semiconductor device comprising:
   a gate line disposed on an upper surface of a semiconductor substrate;
   a first active region including a first channel region disposed below the gate line and including a first conductivity-type impurity;
   a second active region disposed to be separated from the first active region in a first direction parallel to the upper surface of a substrate, including a second channel region disposed below the gate line, and including the first conductivity-type impurity; and
   a plurality of metal wirings disposed at a first height level above the semiconductor substrate,
   wherein at least one metal wiring, among the plurality of metal wirings, is directly electrically connected to the first active region, the plurality of metal wirings at the first height level are electrically separated from the second active region, and at least one metal wiring, among the plurality of metal wirings, is connected to receive a signal applied to the gate line.

2. The semiconductor device of claim 1, wherein the gate line and the first active region define a first transistor,
   wherein the plurality of metal wirings are disposed above and vertically overlap the first transistor and include two or fewer metal wirings extending in a second direction, perpendicular to the first direction and parallel to the upper surface of the semiconductor substrate.

3. The semiconductor device of claim 1, wherein an area of the first channel region is greater than an area of the second channel region.

4. The semiconductor device of claim 1, wherein a length of the second active region in a second direction perpendicular to the first direction and parallel to the upper surface of the semiconductor substrate is the same as a length of the first active region in the second direction.

5. The semiconductor device of claim 1, wherein a length of the second active region in a second direction perpendicular to the first direction and parallel to the upper surface of the semiconductor substrate is shorter than a length of the first active region in the second direction.

6. The semiconductor device of claim 1, wherein the second active region does not overlap at least some of the plurality of metal wirings in a third direction, perpendicular to the upper surface of the semiconductor substrate.

7. The semiconductor device of claim 1, wherein the second active region does not comprise at least one of a source region or a drain region.

8. The semiconductor device of claim 1, wherein at least one contact is disposed in lateral upper portions of the second active region with reference to the gate line, wherein the at least one contact is electrically separated from the plurality of metal wirings.

9. The semiconductor device of claim 1, wherein at least a portion of the gate line above the first channel region and the second channel region has different lengths in a second direction, perpendicular to the first direction and parallel to the upper surface of the semiconductor substrate.

10. The semiconductor device of claim 1, wherein the gate line above the second channel region comprises a first region having a first width and a second region having a second width different from the first width in a second direction, perpendicular to the first direction and parallel to the upper surface of the semiconductor substrate.

11. The semiconductor device of claim 1, wherein at least a portion of the gate line above the second channel region extends in one direction, parallel to the upper surface of the semiconductor substrate and different from the first direction.

12. The semiconductor device of claim 1, wherein an area of the second channel region is the same as an area of the second active region.

13. The semiconductor device of claim 1, further comprising:
   a third active region disposed to be separated from the first active region and second active region in the first direction, and including a third channel region disposed below the gate line and including a second conductivity-type impurity.

14. A semiconductor device comprising:
   a plurality of gate lines disposed on an upper surface of a semiconductor substrate, and including a plurality of first gate lines, and a second gate line having a length different from a length of each of the plurality of first gate lines;
   a first active region including first channel regions disposed below the plurality of gate lines and including a first conductivity-type impurity;
   a second active region disposed to be separated from the first active region in a first direction parallel to the upper surface of the semiconductor substrate, including a second channel region disposed below the gate line, and including the first conductivity-type impurity; and
   a third active region including third channel regions disposed below the plurality of gate lines and including a second conductivity-type impurity,
   wherein a structure of the second gate line above each of the first channel regions is different from a structure of the second gate line above the second channel region.

15. The semiconductor device of claim 14, wherein the second gate line and at least one first gate line among the plurality of first gate lines share the first active region.

16. The semiconductor device of claim 14, wherein the first conductivity-type impurity is an N-type impurity, and the second conductivity-type impurity is a P-type impurity.

17. The semiconductor device of claim 14, wherein each of the plurality of gate lines and the first active region define a first transistor,
   the second gate line and the second active region define a second transistor, and
   each of the plurality of gate lines and the third active region define a third transistor,
   wherein the second active region is floated, and the second transistor is a dummy transistor.

18. The semiconductor device of claim 14, further comprising:
   a dummy region disposed in a position adjacent to the plurality of first gate lines in the first direction and adjacent to the second active region in a second direction, perpendicular to the first direction and parallel to the upper surface of the semiconductor substrate.

19. A semiconductor device comprising:
   a gate line disposed on an upper surface of a semiconductor substrate;
   a plurality of active regions including a plurality of channel regions below the gate line, which plurality of channel regions includes all channel regions of the semiconductor device, the channel regions disposed to be separated from each other in a first direction parallel to the upper surface of the semiconductor substrate;
   a plurality of metal wirings disposed at a first height level to be electrically connected to the gate line and to a set of active regions including at least two of the plurality of active regions, the plurality of metal wirings including all metal wirings at the first height level of the semiconductor device; and
   a plurality of contacts connected to a set of active regions of the plurality of active regions,
   wherein the semiconductor device is laid out to have a ratio of a total area of the plurality of metal wirings to a total area of the plurality of channel regions to be a value of 0.4 or more and 400 or less.

20. The semiconductor device of claim 19, wherein the plurality of active regions further comprise a first active region connected to at least one of the plurality of contacts and a second active region separated from the plurality of contacts,
   wherein the gate line and the second active region define a dummy transistor.

* * * * *